United States Patent
Fallon et al.

(10) Patent No.: US 12,045,730 B1
(45) Date of Patent: Jul. 23, 2024

(54) SYSTEM, METHOD, AND COMPUTER PROGRAM PRODUCT FOR ANALOG AND MIX-SIGNAL CIRCUIT PLACEMENT

(71) Applicant: Cadence Design Systems, Inc., San Jose, CA (US)

(72) Inventors: Elias Lee Fallon, Allison Park, PA (US); David Allan White, San Jose, CA (US); Regis R Colwell, Gibsonia, PA (US); Hongzhou Liu, Sewickley, PA (US); Hui Xu, Wexford, PA (US); Wangyang Zhang, Allison Park, PA (US); Shang Li, Greenbelt, MD (US); Hua Luo, Pittsburgh, PA (US)

(73) Assignee: Cadence Design Systems, Inc., San Jose, CA (US)

( * ) Notice: Subject to any disclaimer, the term of this patent is extended or adjusted under 35 U.S.C. 154(b) by 1300 days.

(21) Appl. No.: 16/238,274

(22) Filed: Jan. 2, 2019

(51) Int. Cl.
*G06N 3/126* (2023.01)
*G06F 30/392* (2020.01)

(52) U.S. Cl.
CPC ........... *G06N 3/126* (2013.01); *G06F 30/392* (2020.01)

(58) Field of Classification Search
CPC ..... G06N 3/126; G06F 30/392; G06F 30/396; G06F 2111/00–2119/22
See application file for complete search history.

(56) References Cited

PUBLICATIONS

Leung et al. "A fast layer-based heuristic for non-guillotine strip packing" Expert Systems with Applications 38 (2011), pp. 13032-13042 [retrieved on Jul. 28, 2022] (Year: 2011).*
Goncalves et al. "Biased random-key genetic algorithms for combinatorial optimization" J Heuristics (2011) vol. 17, pp. 487-525; DOI:10.1007/s10732-010-9143-1 [retrieved on Jul. 28, 2022] (Year: 2011).*
Gwee et al. "A GA with heuristic-based decoder for IC floorplanning" Integration, the VLSI journal, vol. 28 (1999) pp. 157-172 [retrieved on Jul. 26, 2022] (Year: 1999).*
Sherwani, N. "Algorithms for VLSI Physical Design Automation" Third Edition; Kluwer Academic Publishers; ISBN: 0-306-47509-X [retrieved on Jul. 30, 2022] (Year: 2002).*

(Continued)

*Primary Examiner* — Rehana Perveen
*Assistant Examiner* — Alfred H B Wechselberger
(74) *Attorney, Agent, or Firm* — Mark H. Whittenberger; Holland & Knight LLP

(57) ABSTRACT

The present disclosure relates to a computer-implemented method for genetic placement of analog and mix-signal circuit components. Embodiments may include receiving an unplaced layout associated with an electronic circuit design and grouping requirements. Embodiments may also include identifying one or more instances that need to be placed in the unplaced layout and areas of the unplaced layout configured to receive the instances. Embodiments may further include analyzing one or more instances that need to be placed in the unplaced layout and the areas of the unplaced layout configured to receive the instances, wherein analyzing is based upon a row-based data structure. Embodiments may also include determining a location and an orientation for each of the one or more instances based upon the genetic algorithm and generating a placed layout based upon the determined location and orientation for each of the instances.

16 Claims, 30 Drawing Sheets

(56) References Cited

PUBLICATIONS

Zhang et al. "Placement Algorithm in Analog-Layout Designs" IEEE Transactions on Computer-Aided Design of Integrated Circuits and Systems, vol. 25, No. 10, Oct. 2006 [retrieved on Jul. 29, 2022] (Year: 2006).*

Werner et al. "Decision Modelling Algorithm in permutation problems using genetic algorithm" DOI: 10.13140/RG.2.1.3812.4243 (Year: 2015).*

Goodman et al. "A Genetic Algorithm Approach to Compaction, Bin Packing, and Nesting Problems" Michigan State University; Technical Report #940702 [retrieved on Jul. 29, 2022] (Year: 1994).*

Bueno, L. "Biased Random-Key Genetic Algorithm for Warehouse Reshuffling" [Thesis] Federal University of Pernambuco (Available on Aug. 19, 2019) (Year: 2019).*

Shahookar et al. "A Genetic Approach to Standard Cell Placement Using Meta-Genetic Parameter Optimization" IEEE Transactions on Computer-Aided Design, vol. 9, No. 5, May 1990 [retrieved on Jul. 28, 2022] (Year: 1990).*

Holt et al. "Geep: A Low Power Genetic Algorithm Layout System" Proceedings of the 39th Midwest Symposium on Circuits and Systems; DOI: 10.1109/MWSCAS.1996.593180 [retrieved on Apr. 3, 2024] (Year: 1996).*

* cited by examiner

| index | 1 | 2 | 3 | 4 | 5 |
|---|---|---|---|---|---|
| order | 0.8 | 0.5 | 0.1 | 0.2 | 0.9 |
| row | 0.8 | 0.4 | 0.8 | 0.9 | 0.1 | sort by the value of order row

| index | 3 | 4 | 2 | 1 | 5 |
|---|---|---|---|---|---|
| order | 0.1 | 0.2 | 0.5 | 0.8 | 0.9 |
| row | 0.8 | 0.9 | 0.4 | 0.8 | 0.1 |

Place order from the index row.
Place direction. > 0.7 new row. < 0.7 same row. 3, 4, 2, 1, 5 Y, Y, N, Y, N

FIG. 10

Parent1 | 0.14 | 0.08 | 0.55 | 0.72 | 0.34 | 0.88 | 0.81 | 0.75

0.2 Uniform 0.23 0.55 0.82 0.11 0.36 0.90 0.08 0.66

Parent2 | 0.46 | 0.37 | 0.11 | 0.08 | 0.55 | 0.34 | 0.50 | 0.90

Offspring | 0.46 | 0.37 | 0.55 | 0.72 | 0.34 | 0.88 | 0.50 | 0.75

FIG. 14

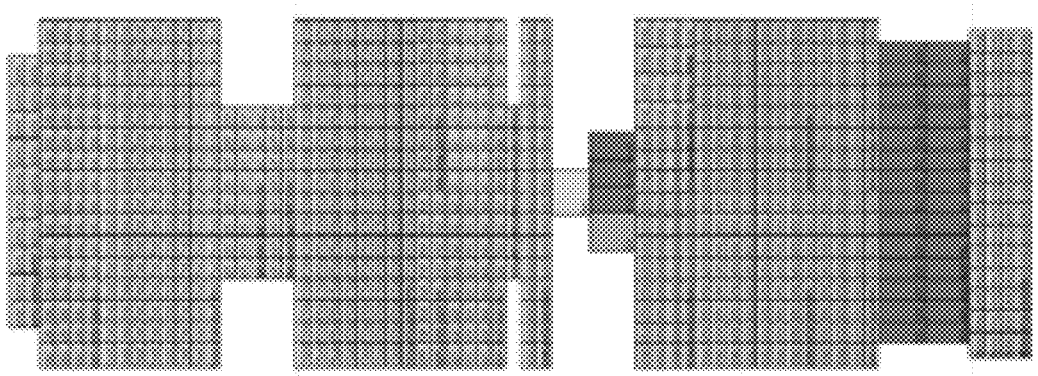
after
before
FIG. 24
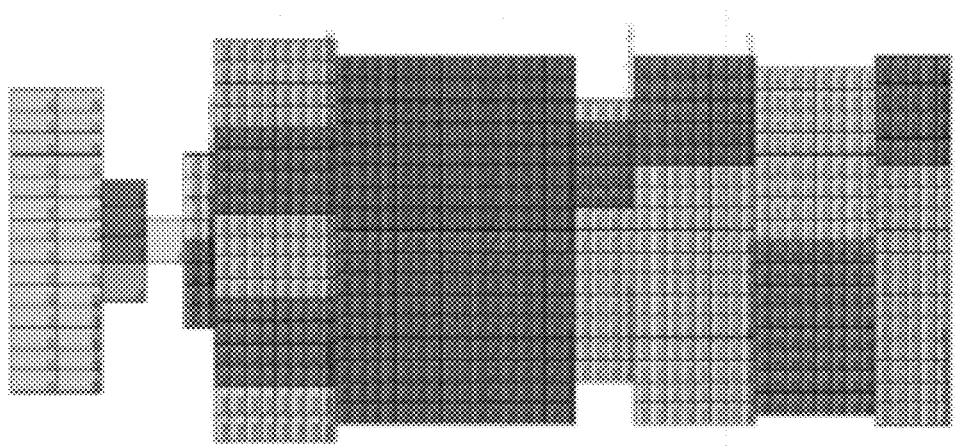

SYSTEM, METHOD, AND COMPUTER PROGRAM PRODUCT FOR ANALOG AND MIX-SIGNAL CIRCUIT PLACEMENT

GOVERNMENT RIGHTS

This invention was made with Government support under Agreement No. HR0011-18-3-0010, awarded by DARPA. The Government has certain rights in the invention.

FIELD OF THE INVENTION

The present disclosure relates to electronic circuit design, and more specifically, to analog and mix-signal circuit placement using genetic algorithms.

DISCUSSION OF THE RELATED ART

In existing electronic circuit design systems it may be possible to operate upon analog and mix-signal layouts. It is challenging to automatically place analog devices at the graphical user interface of existing design tools to meet snapping, row style requirements, and/or grouping requirements. If we formulate each possible instance's X and Y as optimization variables, the major design space (e.g., (x1,y1), (x2,y2), (x3,y3) . . . ) are not feasible because of overlapping. As such, the optimization process may not be efficient as most of the optimization variable sets will generate an overlapped placement. It is also very difficult to place the grouped structure and perform an auto placement based on reference placement.

SUMMARY

In one or more embodiments of the present disclosure, a computer-implemented method for genetic placement of analog and mix-signal circuit components is provided. The method may include receiving, using at least one processor, an unplaced layout associated with an electronic circuit design and one or more grouping requirements. The method may also include identifying one or more instances that need to be placed in the unplaced layout and one or more areas of the unplaced layout configured to receive the one or more instances. The method may further include analyzing one or more instances that need to be placed in the unplaced layout and the one or more areas of the unplaced layout configured to receive the one or more instances, wherein analyzing is based upon, at least in part, a row-based data structure. The method may also include determining a location and an orientation for each of the one or more instances based upon, at least in part, the analyzing and generating a placed layout based upon, at least in part, the determined location and orientation for each of the one or more instances.

One or more of the following features may be included. In some embodiments, analyzing may include a cost function. Analyzing may include analyzing a sequence variable configured to maintain the row-based data structure. Analyzing may include analyzing a row variable configured to determine whether at least one of the identified one or more instances belongs in a first row of instances or a second row of instances. Determining the location and the orientation for each of the one or more instances may include setting a positional threshold identifying a subset of the one or more instances relating to a particular location. The cost function may be based upon, at least in part, a minimum area value. The cost function may be based upon, at least in part, a minimum wirelength value. Analyzing may include encoding one or more steps associated with the genetic algorithm, the one or more steps selected from the group consisting of, a device order, a device row placement decision, and an aspect ratio. Analyzing may include varying an aspect ratio associated with the row-based data structure. Generating the placed layout may include optimizing one or more pin placements. The method may include determining a genetic code based upon, at least in part, the placed layout and iteratively refining the placed layout based upon, at least in part, the genetic code. Analyzing may include analyzing a group variable configured to determine the relative placement or aspect ratio of a group.

In one or more embodiments of the present disclosure, a system for genetic placement of analog and mix-signal circuit components is provided. The system may include a computing device having at least one processor configured to receive an unplaced layout associated with an electronic circuit design and one or more grouping requirements. The at least one processor may be further configured to identify one or more instances that need to be placed in the unplaced layout and one or more areas of the unplaced layout configured to receive the one or more instances. The at least one processor may be configured to apply a genetic algorithm to the identified one or more instances that need to be placed in the unplaced layout and the one or more areas of the unplaced layout configured to receive the one or more instances, wherein applying the genetic algorithm is based upon, at least in part, a row-based data structure. The at least one processor may be further configured to determine a location and an orientation for each of the one or more instances based upon, at least in part, the genetic algorithm and to generate a placed layout based upon, at least in part, the determined location and orientation for each of the one or more instances.

One or more of the following features may be included. In some embodiments, the genetic algorithm includes a cost function. Applying the genetic algorithm may include analyzing a sequence variable configured to maintain the row-based data structure. Applying the genetic algorithm may include analyzing a row variable configured to determine whether at least one of the identified one or more instances belongs in a first row of instances or a second row of instances.

In yet another embodiment of the present disclosure a non-transitory computer readable medium having stored thereon instructions that when executed by a processor result in one or more operations is included. Operations may include receiving, using at least one processor, an unplaced layout associated with an electronic circuit design and one or more grouping requirements. Operations may also include identifying one or more instances that need to be placed in the unplaced layout and one or more areas of the unplaced layout configured to receive the one or more instances. Operations may further include applying an evolutionary analysis to the identified one or more instances that need to be placed in the unplaced layout and the one or more areas of the unplaced layout configured to receive the one or more instances, wherein applying the evolutionary analysis is based upon, at least in part, a row-based data structure. Operations may also include determining a location and an orientation for each of the one or more instances based upon, at least in part, the evolutionary analysis and generating a placed layout based upon, at least in part, the determined location and orientation for each of the one or more instances.

One or more of the following features may be included. In some embodiments, the evolutionary analysis may include a cost function. Applying the evolutionary analysis may include analyzing a sequence variable configured to maintain the row-based data structure. Applying the evolutionary analysis may include analyzing a row variable configured to determine whether at least one of the identified one or more instances belongs in a first row of instances or a second row of instances. Determining the location and the orientation for each of the one or more instances may include setting a positional threshold identifying a subset of the one or more instances relating to a particular location.

Additional features and advantages of embodiments of the present disclosure will be set forth in the description which follows, and in part will be apparent from the description, or may be learned by practice of embodiments of the present disclosure. The objectives and other advantages of the embodiments of the present disclosure may be realized and attained by the structure particularly pointed out in the written description and claims hereof as well as the appended drawings.

It is to be understood that both the foregoing general description and the following detailed description are exemplary and explanatory and are intended to provide further explanation of embodiments of the invention as claimed.

BRIEF DESCRIPTION OF THE DRAWINGS

The accompanying drawings, which are included to provide a further understanding of embodiments of the present disclosure and are incorporated in and constitute a part of this specification, illustrate embodiments of the present disclosure and together with the description serve to explain the principles of embodiments of the present disclosure.

FIG. 10 is a diagram depicting aspects of a circuit placement process in accordance with an embodiment of the present disclosure;

FIG. 14 is a diagram showing an example of crossover in accordance with an embodiment of the present disclosure;

FIG. 24 is a diagram depicting aspects of a circuit placement process in accordance with an embodiment of the present disclosure;

DETAILED DESCRIPTION

Figure 1:
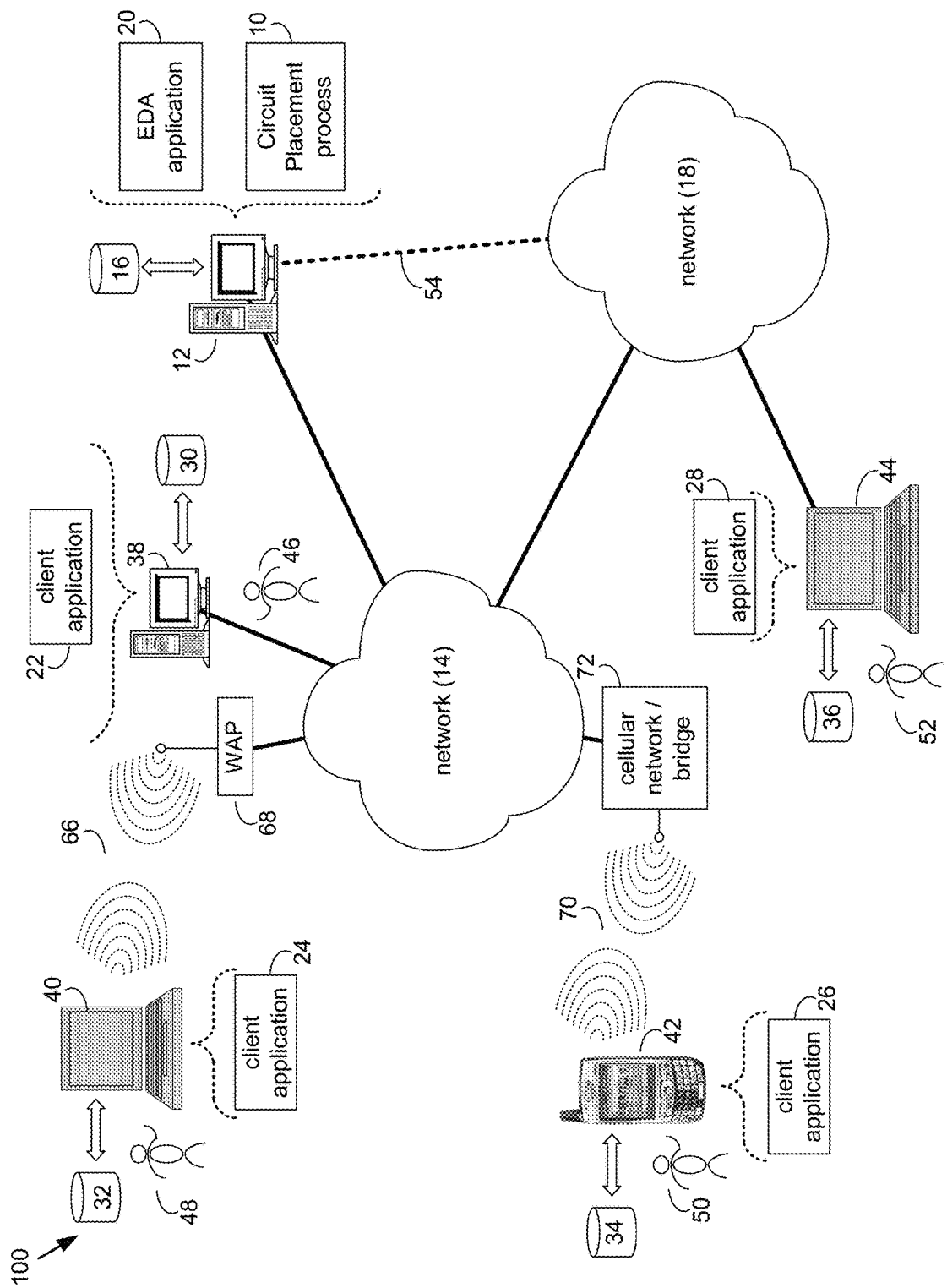
FIG. 1 is a diagram depicting an embodiment of a system in accordance with the present disclosure.

Reference will now be made in detail to the embodiments of the present disclosure, examples of which are illustrated in the accompanying drawings. The present disclosure may, however, be embodied in many different forms and should not be construed as being limited to the embodiments set forth herein. Rather, these embodiments are provided so that this disclosure will be thorough and complete, and will fully convey the concept of the disclosure to those skilled in the art.

As will be appreciated by one skilled in the art, the present disclosure may be embodied as a method, system, or computer program product. Accordingly, the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present disclosure may take the form of a computer program product on a computer-usable storage medium having computer-usable program code embodied in the medium.

As used in any embodiment described herein, "circuitry" may include, for example, singly or in any combination, hardwired circuitry, programmable circuitry, state machine circuitry, and/or firmware that stores instructions executed by programmable circuitry. It should be understood at the outset that any of the operations and/or operative components described in any embodiment herein may be implemented in software, firmware, hardwired circuitry and/or any combination thereof.

Any suitable computer usable or computer readable medium may be utilized. The computer readable medium may be a computer readable signal medium or a computer readable storage medium. A computer-usable, or computer-readable, storage medium (including a storage device associated with a computing device or client electronic device) may be, for example, but not limited to, an electronic, magnetic, optical, electromagnetic, infrared, or semiconductor system, apparatus, or device, or any suitable combination of the foregoing. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device. In the context of this document, a computer-usable, or computer-readable, storage medium may be any tangible medium that can contain, or store a program for use by or in connection with the instruction execution system, apparatus, or device.

A computer readable signal medium may include a propagated data signal with computer readable program coded embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations of the present invention may be written in an object oriented programming language such as Java, Smalltalk, C++ or the like. However, the computer program code for carrying out operations of the present invention may also be written in conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through a local area network (LAN) or a wide area network (WAN), or the connection may be made to an external computer (for example, through the Internet using an Internet Service Provider).

The present invention is described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable memory that can direct a computer or other programmable data processing apparatus to function in a particular manner, such that the instructions stored in the computer-readable memory produce an article of manufacture including instructions which implement the function/act specified in the flowchart and/or block diagram block or blocks. The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions/acts specified in the flowchart and/or block diagram block or blocks.

One or more hardware description languages may be used in accordance with the present disclosures. Some hardware description languages may include, but are not limited to, Verilog, VHDL, and Verilog-AMS. Various other hardware description languages may also be used as well.

Referring to FIG. 1, there is shown circuit placement process 10 that may reside on and may be executed by server computer 12, which may be connected to network 14 (e.g., the Internet or a local area network). Examples of server computer 12 may include, but are not limited to: a personal computer, a server computer, a series of server computers, a mini computer, and a mainframe computer. Server computer 12 may be a web server (or a series of servers) running a network operating system, examples of which may include but are not limited to: Microsoft® Windows® Server; Novell® NetWare®; or Red Hat® Linux®, for example. (Microsoft and Windows are registered trademarks of Microsoft Corporation in the United States, other countries or both; Novell and NetWare are registered trademarks of Novell Corporation in the United States, other countries or both; Red Hat is a registered trademark of Red Hat Corporation in the United States, other countries or both; and Linux is a registered trademark of Linus Torvalds in the United States, other countries or both.) Additionally/alternatively, the circuit placement process 10 may reside on and be executed, in whole or in part, by a client electronic device, such as a personal computer, notebook computer, personal digital assistant, or the like.

The instruction sets and subroutines of circuit placement process 10, which may include one or more software modules, and which may be stored on storage device 16 coupled to server computer 12, may be executed by one or more processors (not shown) and one or more memory modules (not shown) incorporated into server computer 12. Storage device 16 may include but is not limited to: a hard disk drive; a solid state drive, a tape drive; an optical drive; a RAID array; a random access memory (RAM); and a read-only memory (ROM). Storage device 16 may include various types of files and file types including but not limited, to hardware description language (HDL) files, which may contain the port type descriptions and executable specifications of hardware blocks.

Server computer 12 may execute a web server application, examples of which may include but are not limited to: Microsoft IIS, Novell Webserver™, or Apache® Webserver, that allows for HTTP (e.g., HyperText Transfer Protocol) access to server computer 12 via network 14 (Webserver is a trademark of Novell Corporation in the United States, other countries, or both; and Apache is a registered trademark of Apache Software Foundation in the United States, other countries, or both). Network 14 may be connected to one or more secondary networks (e.g., network 18), examples of which may include but are not limited to: a local area network; a wide area network; or an intranet, for example.

Server computer 12 may execute an electronic design automation (EDA) application (e.g., EDA application 20), examples of which may include, but are not limited to those available from the assignee of the present application. EDA application 20 may interact with one or more EDA client applications (e.g., EDA client applications 22, 24, 26, 28) for electronic design optimization.

Circuit placement process 10 may be a stand alone application, or may be an applet/application/script that may interact with and/or be executed within EDA application 20. In addition/as an alternative to being a server-side process, the circuit placement process may be a client-side process (not shown) that may reside on a client electronic device (described below) and may interact with an EDA client application (e.g., one or more of EDA client applications 22, 24, 26, 28). Further, the circuit placement process may be a hybrid server-side/client-side process that may interact with EDA application 20 and an EDA client application (e.g., one or more of client applications 22, 24, 26, 28). As such, the circuit placement process may reside, in whole, or in part, on server computer 12 and/or one or more client electronic devices.

The instruction sets and subroutines of EDA application 20, which may be stored on storage device 16 coupled to server computer 12 may be executed by one or more processors (not shown) and one or more memory modules (not shown) incorporated into server computer 12.

The instruction sets and subroutines of EDA client applications 22, 24, 26, 28, which may be stored on storage devices 30, 32, 34, 36 (respectively) coupled to client electronic devices 38, 40, 42, 44 (respectively), may be executed by one or more processors (not shown) and one or more memory modules (not shown) incorporated into client electronic devices 38, 40, 42, 44 (respectively). Storage devices 30, 32, 34, 36 may include but are not limited to: hard disk drives; solid state drives, tape drives; optical drives; RAID arrays; random access memories (RAM); read-only memories (ROM), compact flash (CF) storage devices, secure digital (SD) storage devices, and a memory stick storage devices. Examples of client electronic devices 38, 40, 42, 44 may include, but are not limited to, personal computer 38, laptop computer 40, mobile computing device 42 (such as a smart phone, netbook, or the like), notebook computer 44, for example. Using client applications 22, 24, 26, 28, users 46, 48, 50, 52 may access EDA application 20 and may allow users to e.g., utilize circuit placement process 10.

Users 46, 48, 50, 52 may access EDA application 20 directly through the device on which the client application (e.g., client applications 22, 24, 26, 28) is executed, namely client electronic devices 38, 40, 42, 44, for example. Users 46, 48, 50, 52 may access EDA application 20 directly through network 14 or through secondary network 18. Further, server computer 12 (e.g., the computer that executes EDA application 20) may be connected to network 14 through secondary network 18, as illustrated with phantom link line 54. Some or all of the operations discussed herein with regard to circuit placement process 10 may be performed, in whole or in part, in the cloud as a cloud-based process including, for example, networks 14, 18 and any others.

The various client electronic devices may be directly or indirectly coupled to network 14 (or network 18). For example, personal computer 38 is shown directly coupled to network 14 via a hardwired network connection. Further, notebook computer 44 is shown directly coupled to network 18 via a hardwired network connection. Laptop computer 40 is shown wirelessly coupled to network 14 via wireless communication channel 66 established between laptop computer 40 and wireless access point (e.g., WAP) 68, which is shown directly coupled to network 14. WAP 68 may be, for example, an IEEE 802.11a, 802.11b, 802.11g, Wi-Fi, and/or Bluetooth device that is capable of establishing wireless communication channel 66 between laptop computer 40 and WAP 68. Mobile computing device 42 is shown wirelessly coupled to network 14 via wireless communication channel 70 established between mobile computing device 42 and cellular network/bridge 72, which is shown directly coupled to network 14.

As is known in the art, all of the IEEE 802.11x specifications may use Ethernet protocol and carrier sense multiple access with collision avoidance (e.g., CSMA/CA) for path sharing. The various 802.11x specifications may use phase-shift keying (e.g., PSK) modulation or complementary code keying (e.g., CCK) modulation, for example. As is known in the art, Bluetooth is a telecommunications industry specification that allows e.g., mobile phones, computers, and personal digital assistants to be interconnected using a short-range wireless connection.

Client electronic devices 38, 40, 42, 44 may each execute an operating system, examples of which may include but are not limited to Microsoft Windows, Microsoft Windows CE®, Red Hat Linux, or other suitable operating system. (Windows CE is a registered trademark of Microsoft Corporation in the United States, other countries, or both.)

Figure 2:
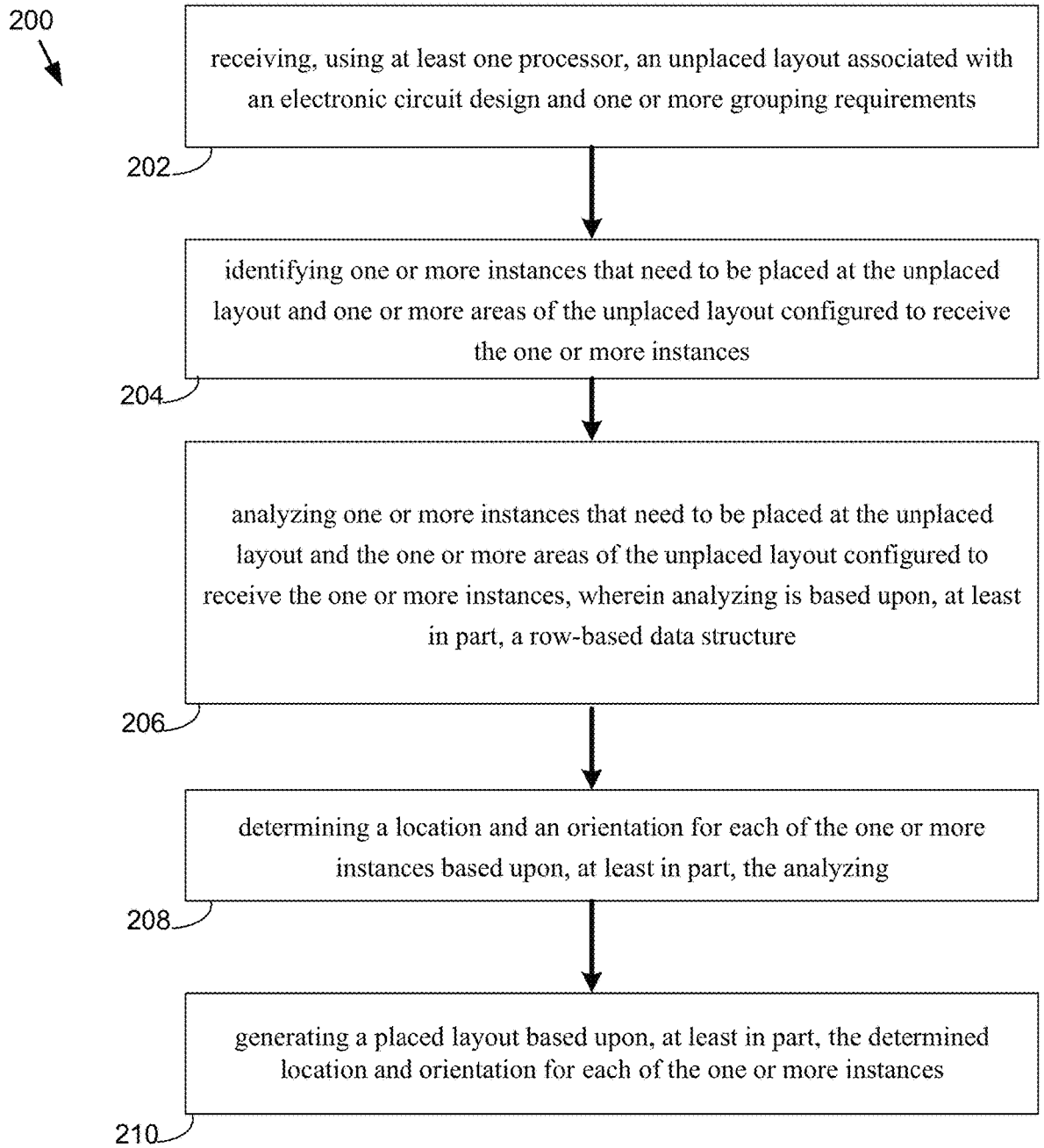
FIG. 2 is a flowchart depicting operations incorporating the circuit placement process in accordance with an embodiment of the present disclosure.

Referring now to FIG. 2, an example flowchart depicting operations consistent with an embodiment of circuit placement process 10 is provided. The process may include receiving (202), using at least one processor, an unplaced layout associated with an electronic circuit design and one or more grouping requirements. Embodiments may also include identifying (204) one or more instances that need to be placed at the unplaced layout and one or more areas of the unplaced layout configured to receive the one or more instances. Embodiments may further include analyzing (206) one or more instances that need to be placed at the unplaced layout and the one or more areas of the unplaced layout configured to receive the one or more instances, wherein analyzing is based upon, at least in part, a row-based data structure. Embodiments may also include determining (208) a location and an orientation for each of the one or more instances based upon, at least in part, the analyzing and generating (210) a placed layout based upon, at least in part, the determined location and orientation for each of the one or more instances.

Figure 3:
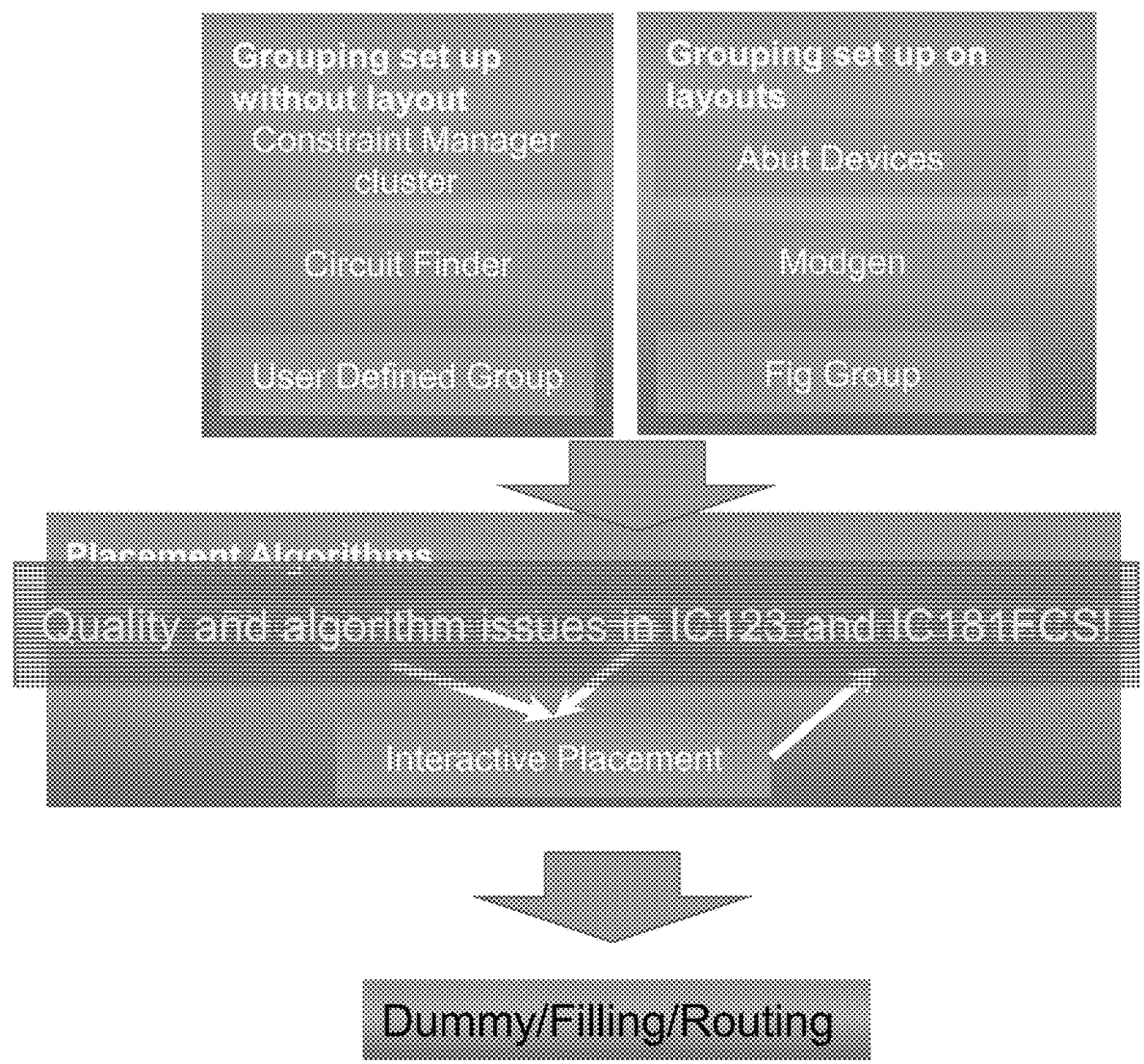
FIG. 3 is a diagram depicting a flowchart in accordance with an embodiment of the present disclosure.

Referring now to FIG. 3, a flowchart depicting example operations associated with analog device placement is provided. In some embodiments, structured devices may need to be grouped together in an analog and mix-signal layout. The device grouping requirements may be imported from any suitable electronic design application. Some of these may include, but are not limited to, constraint manager, module generation, circuit finder or machine learning models, etc. Users may be able to visualize and modify device grouping requirements. The group setup may be stored in a database (e.g. a layout view database, etc.) and may be shared with different algorithms. Users may execute automatic placement algorithms with assisted placement help to finish placement job.

Embodiments of circuit placement process 10 may include an automatic placement algorithm configured to address many of the issues discussed above. In some embodiments, the optimized placement may include a legalized layout without any design rule violations. Device grouping requirements may be input from any suitable locations such as the electronic design applications discussed above. Embodiments of circuit placement process 10 may operate in conjunction with row template functionality available from electronic design tools of the Assignee of the subject application, however, row template capabilities are not required.

In some embodiments, circuit placement process 10 may analyze one or more quality metrics such as area and wire-length, which may be used to determine the quality of placement results. Circuit placement process 10 may produce one placement with minimum area and one placement with minimum wire length. Users may be provided with one or more user-selectable options to adjust the weight of area and/or wire-length for the optimization trade-off.

Figure 4:
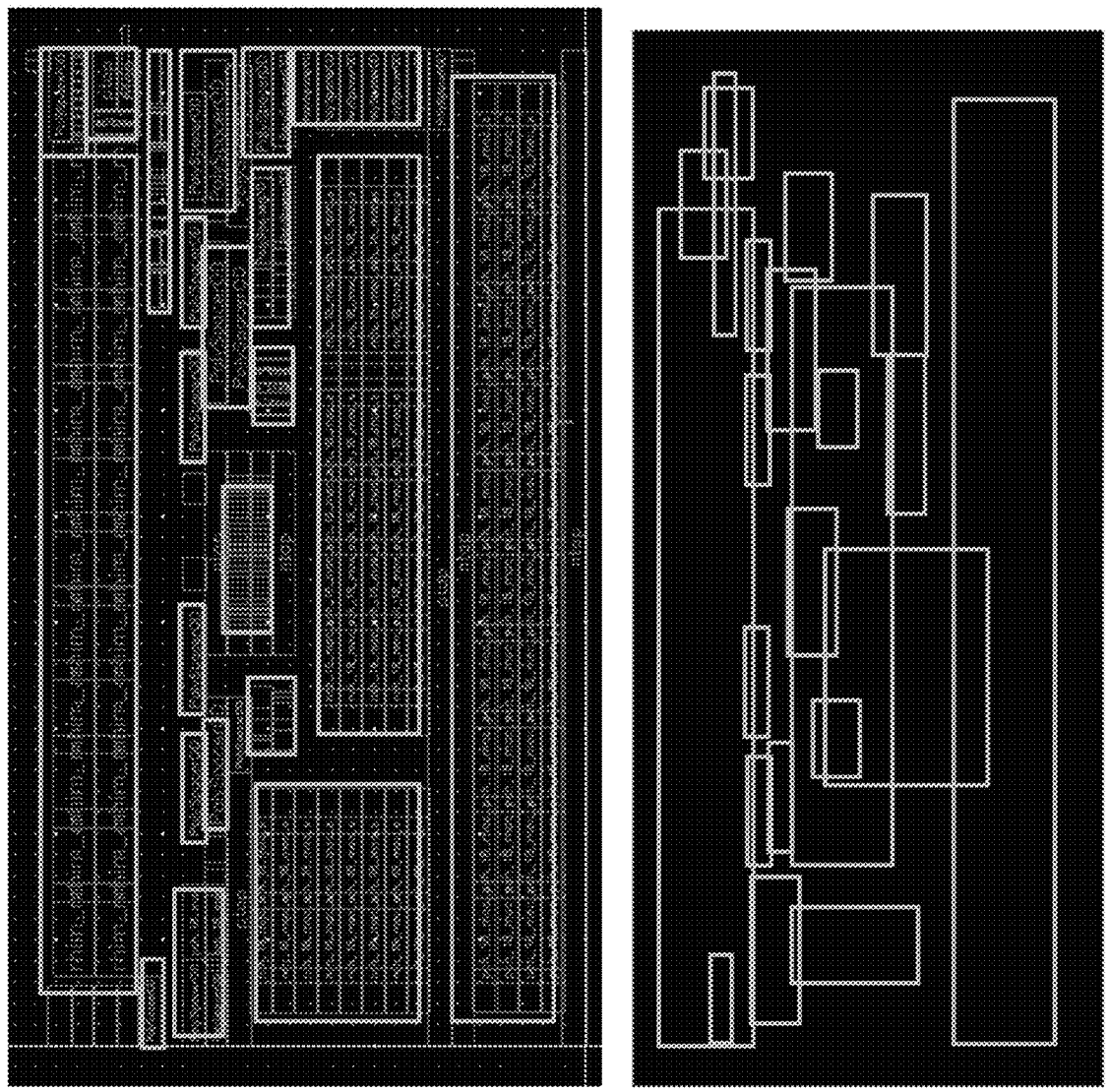
FIG. 4 is a graphical user interface in accordance with an embodiment of the present disclosure.
Figure 4:

Referring now to FIG. 4, two example graphical user interfaces that illustrate some of the challenges in using existing approaches. As shown in the top GUI, if we formulate each place-able instance's X and Y as optimization variables, the major design space ((x1,y1), (x2,y2), (x3,y3) . . . ) are not feasible because of overlapping. This results in an inefficient optimization process. Most of the optimization variable sets would result in an overlapped placement as is shown in the bottom GUI.

Figure 5:
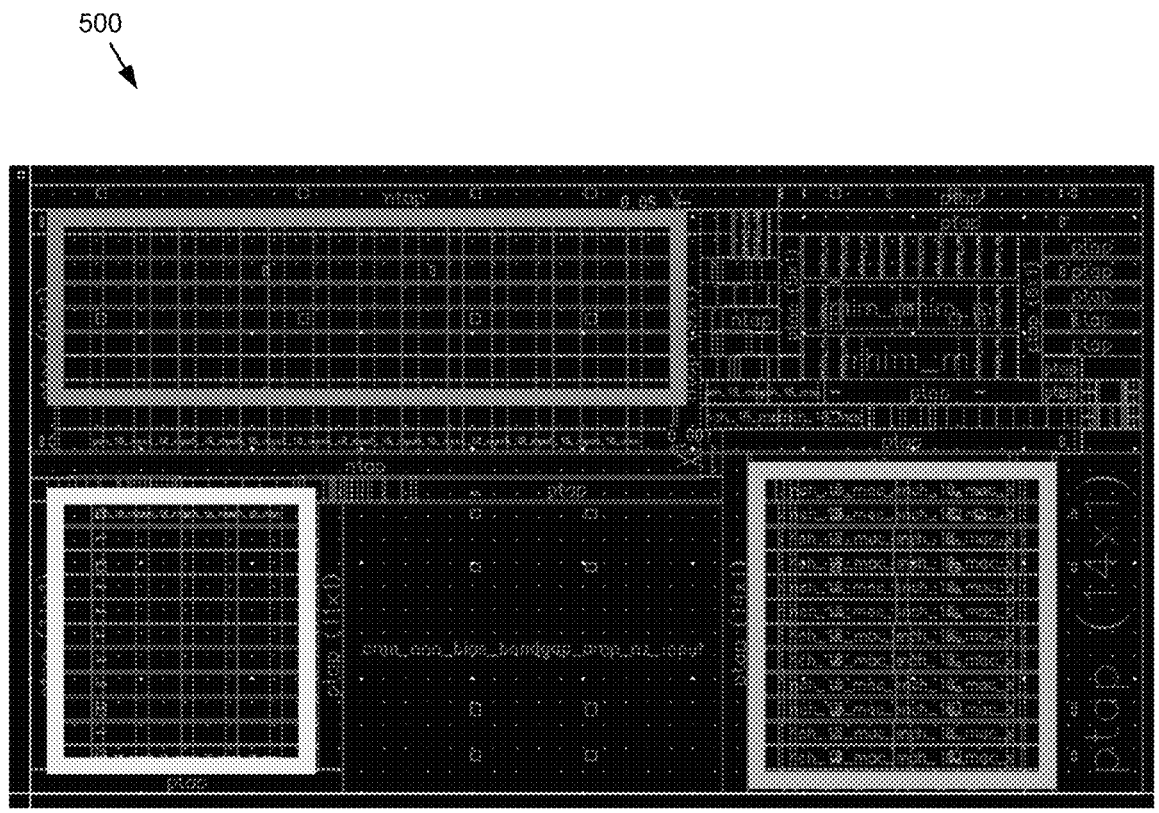
FIG. 5 is a graphical user interface in accordance with an embodiment of the present disclosure.

Referring also to FIG. 5, another graphical user interface illustrating some of the optimization challenges faced by existing approaches is provided. A row styled placement in accordance with the teachings of the present disclosure may be configured to work with or without row templates. Circuit placement process 10 may analyze an existing placement (e.g., schematic, layouts, .txt files, etc.) as a reference placement and optimize both instances and pins placement together during optimization process. Moreover, circuit placement process 10 may optimize the aspect ratio of a group. Each of these concepts are discussed in further detail hereinbelow.

Figure 6:
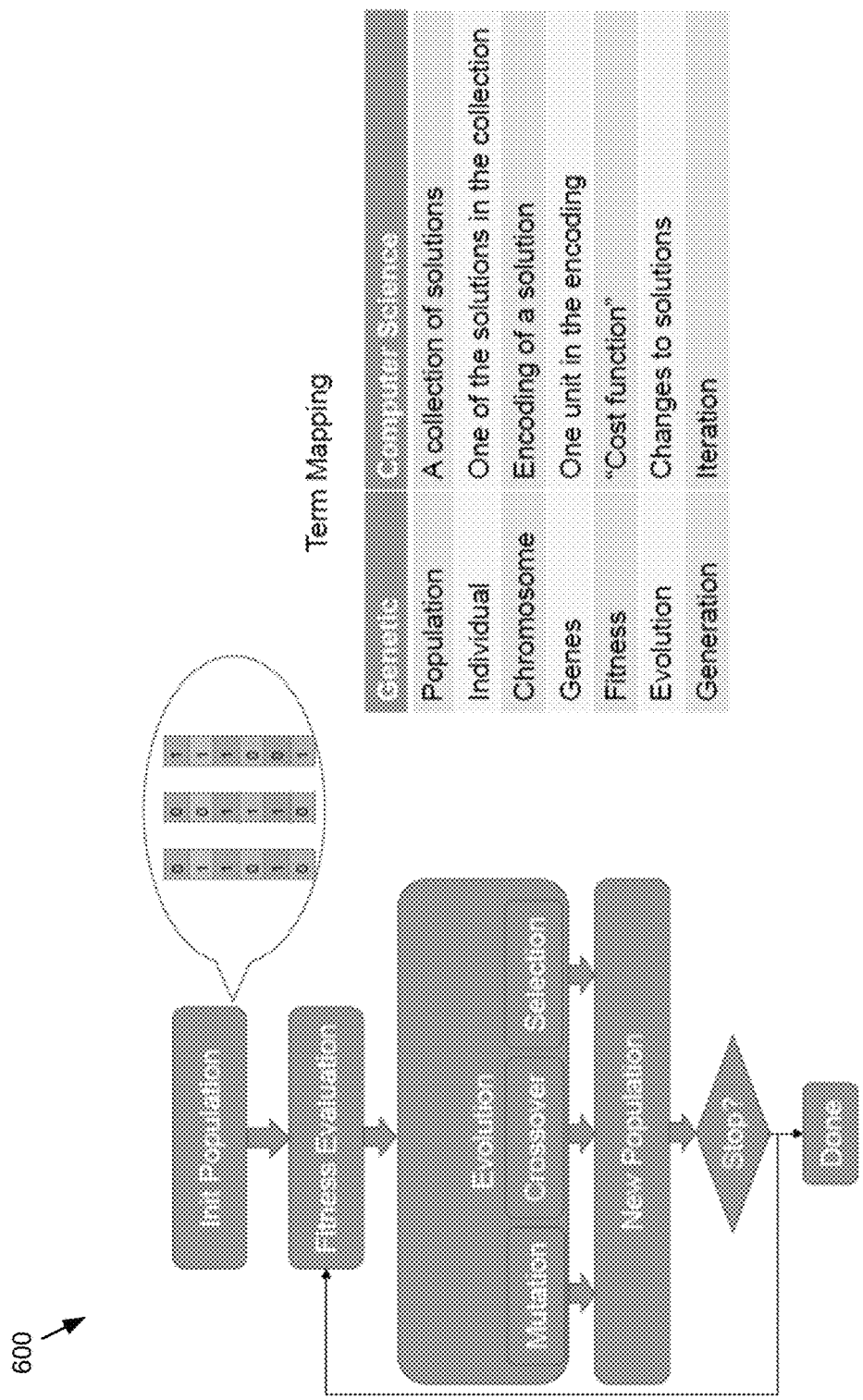
FIG. 6 is a flowchart depicting an example genetic algorithm in accordance with an embodiment of the present disclosure.

Referring now to FIG. 6, a flowchart showing an example genetic algorithm that may be used in accordance with circuit placement process 10 is provided. A genetic algorithm ("GA") generally refers to a bio-inspired or evolutionary algorithm that may be used for optimization and search problems. A GA may simulate the process of natural selection and evolution. The goal is to find the best "fit" individuals or those with the best genes. It should be noted that although certain embodiments included herein may reference genetic algorithms, any analysis process may be used in accordance with the teachings of the present disclosure.

Figure 7:
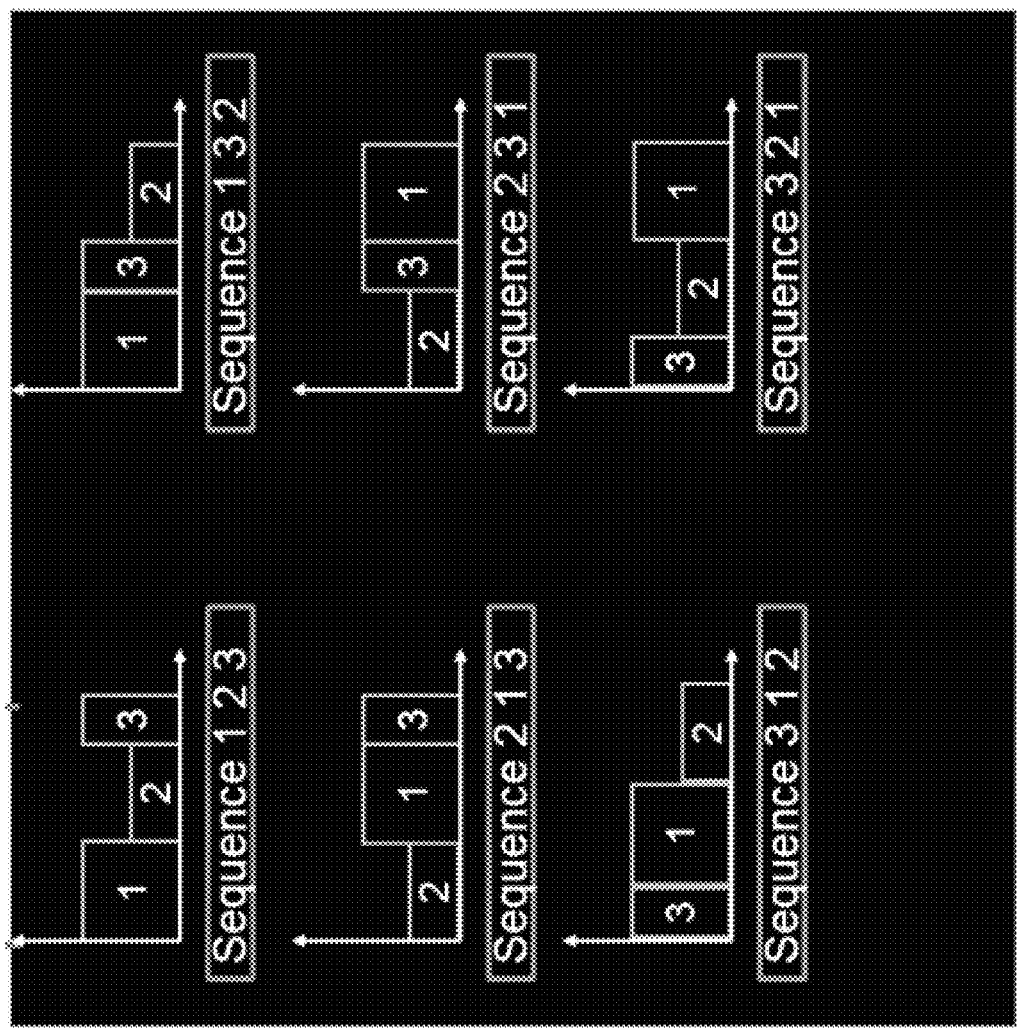
FIG. 7 is a diagram depicting aspects of a circuit placement process in accordance with an embodiment of the present disclosure.
Figure 8:
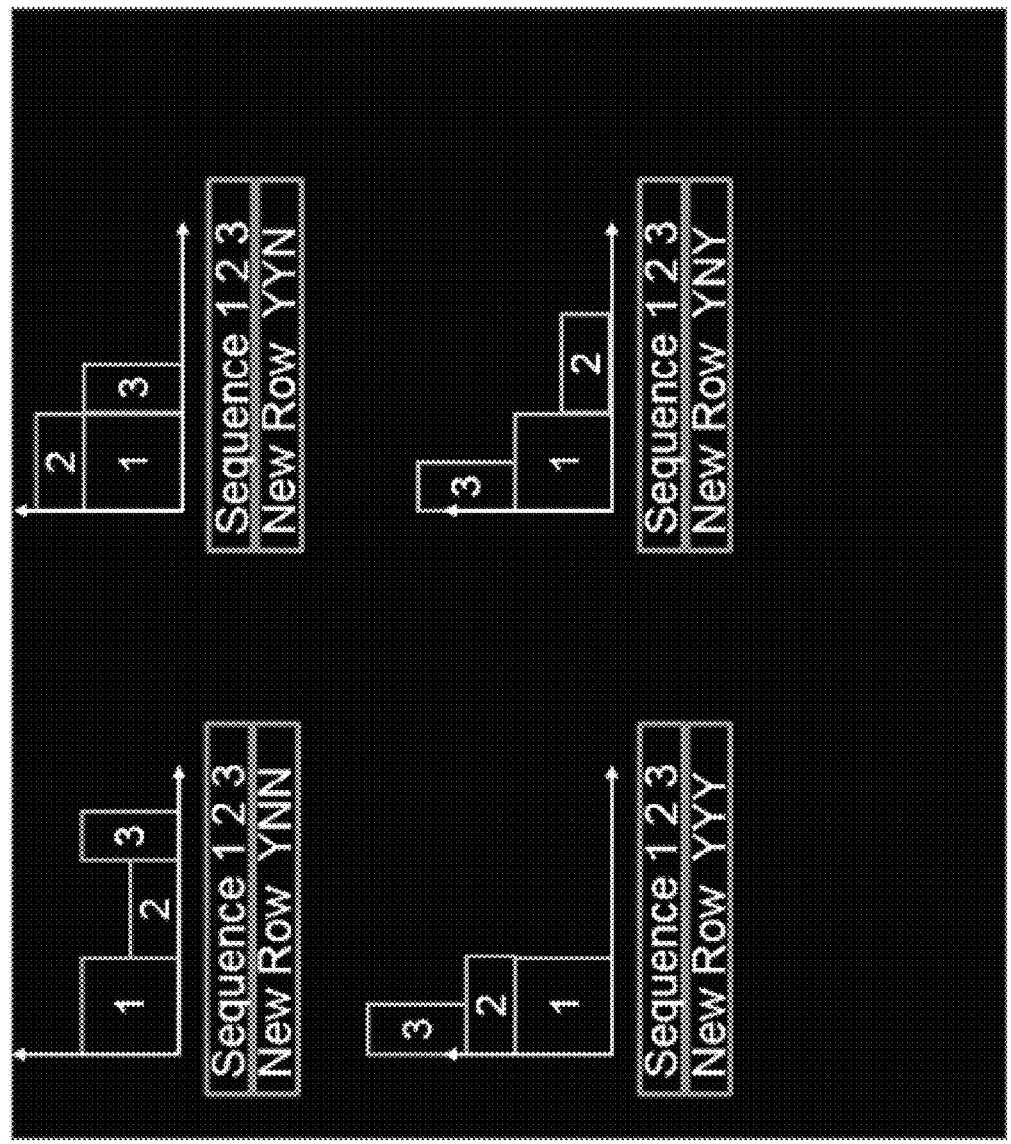
FIG. 8 is a diagram depicting aspects of a circuit placement process in accordance with an embodiment of the present disclosure.

Referring now to FIGS. 7-8, example diagrams showing a number of instances consistent with embodiments of circuit placement process 10 are provided. In some embodiments, optimization variables are introduced, which may be used to encode packing sequences and directions. Some optimization variables may include the sequence variable of FIG. 7 and the new row variable as shown in FIG. 8 each of which are discussed in further detail below.

Referring again to FIG. 7, circuit placement process 10 may be configured to encode one or more packing sequences as optimization variables. Accordingly, each variable set may correspond to a valid and packed placement. As shown in FIG. 7, if the instance is always placed to the leftmost available position in the first row, the sequence determined the placement. The placement is packed and moving a single instance won't make it smaller (e.g., local optimum). For example, for the three instances shown in FIG. 7, there are only six placement results. As such, the optimization design space may be significantly reduced.

Figure 11:
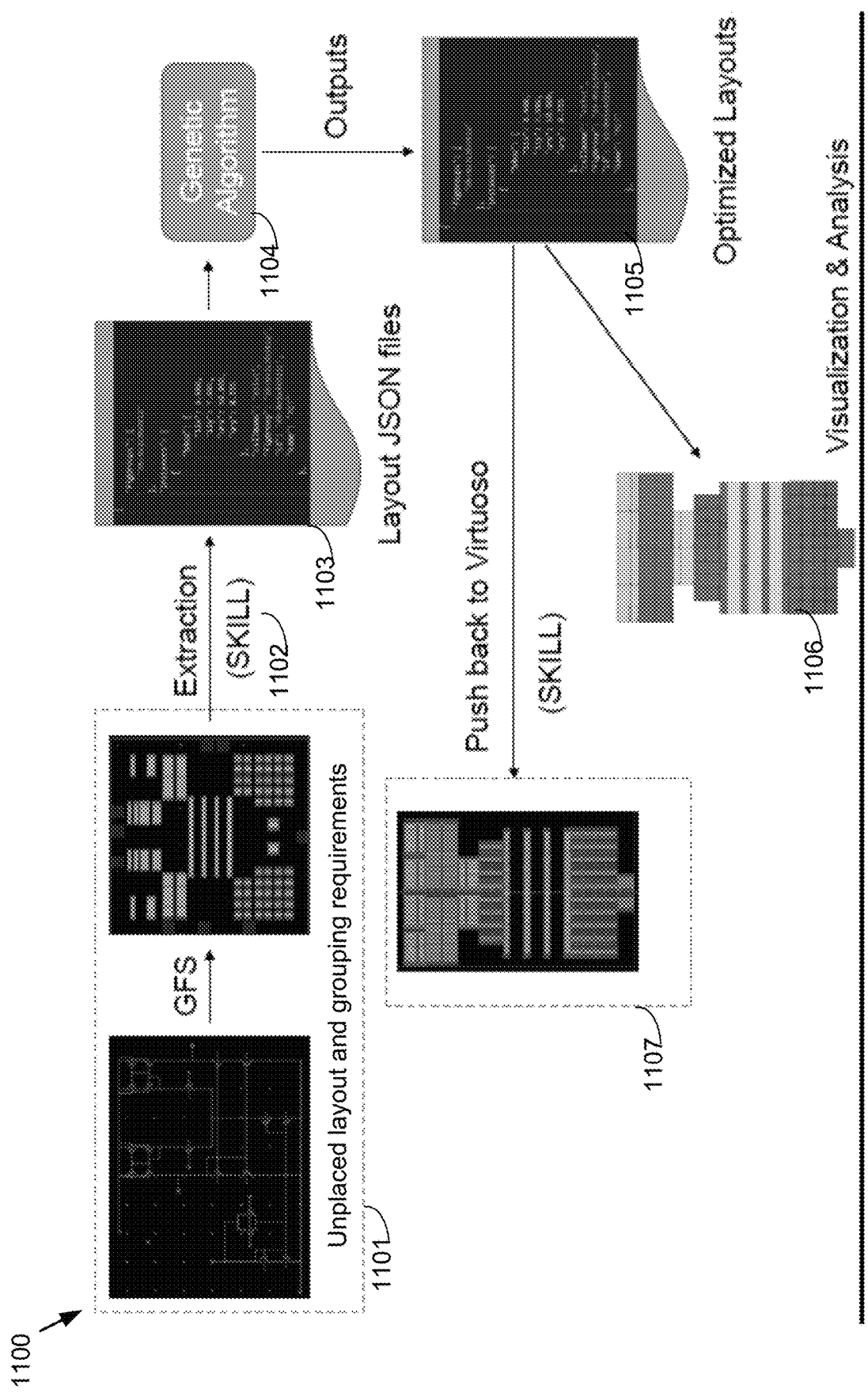
FIG. 11 is a diagram depicting aspects of a circuit placement process in accordance with an embodiment of the present disclosure.

Referring again to FIG. 8, circuit placement process 10 may be configured to encode a packing sequence and a direction as optimization variables. In some embodiments, an additional new row variable may be used to determine whether to place it in the new row. Accordingly, the sequence variable and row variable may present the completed combination of all possible 24 placements, in this particular example. Embodiments included herein may place in either a compact style or a symmetric style. FIG. 8 shows an example of a compact style in which instances are packed to the lower left corner. FIG. 11 shows an example of a symmetric style.

Figure 9:
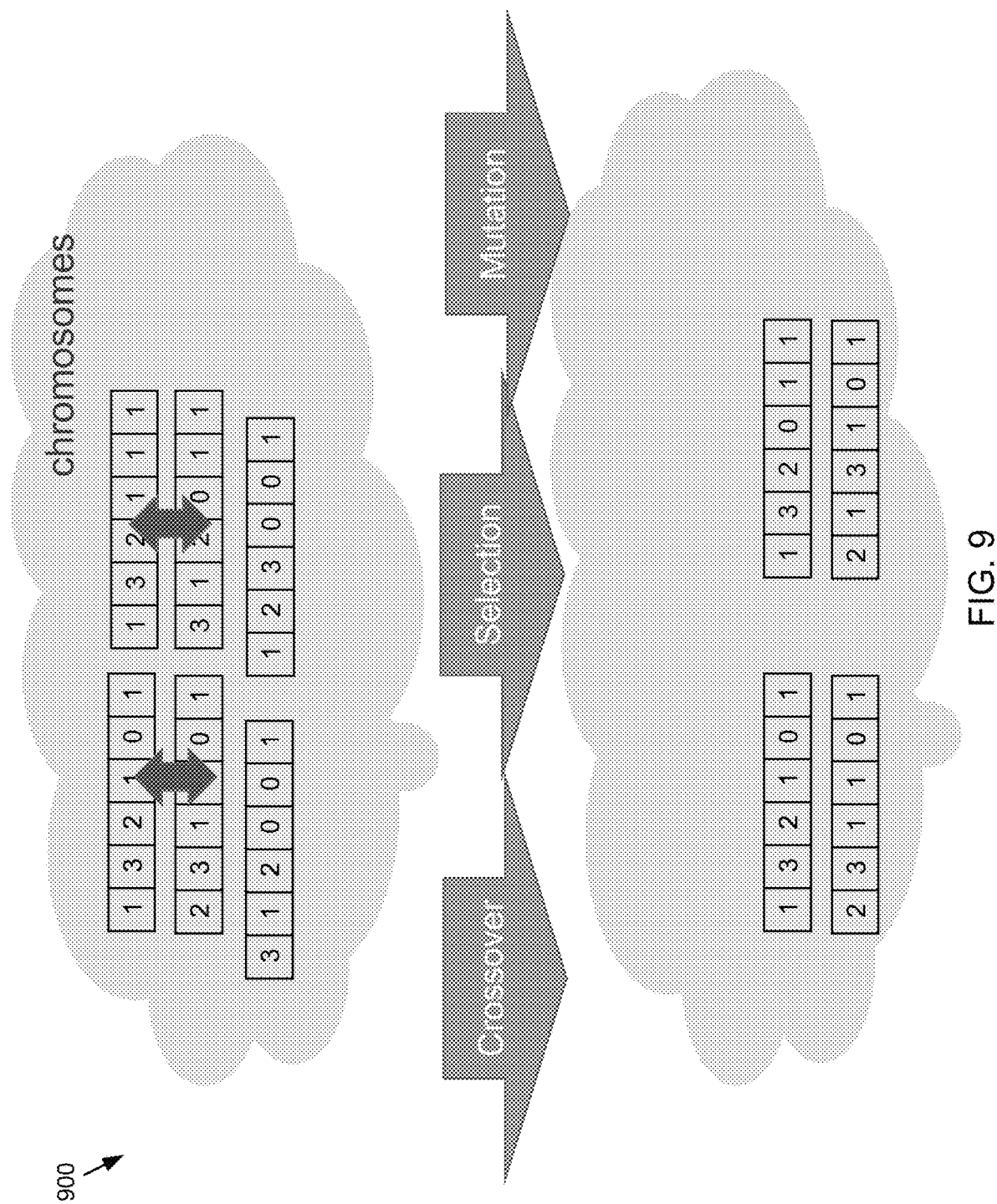
FIG. 9 is a diagram depicting crossover, selection, and mutation in accordance with an embodiment of the present disclosure.

Referring now to FIG. 9, a diagram showing the incorporation of placement variables using a genetic algorithm is provided. In some embodiments, the placement sequence and row may be used to formulate a chromosome. In operation, the process may begin with a random population and then select the best chromosomes. The process may then locate parents to exchange genes to crossover new chromosomes and then randomly generate new chromosomes. The worst chromosomes may not appear in the new generation population. In some embodiments, generation N+1 may consist of the best (as measured by the fitness/cost function) of generation N (this is indicated by "selection" in FIG. 9), offspring of generation N by mating/crossover of randomly picked Gen N individuals (this is indicated by "crossover") and random mutations of random individuals in gen N (labeled as mutants/mutation). The talk about the fitness(/cost) function is stating how selection is done. In some embodiments, mutations may occur at random based upon a mutation rate. For example, when an individual is selected for mutation one gene may be randomly selected and initialized to a random value.

Referring now to FIG. 10, a diagram depicting implementation details associated with an example genetic algorithm is provided. Specifically, an improved chromosome formulation is shown, which may operate better on crossover and mutation. In this example, the gene may be a floating number between 0.0 and 1.0. Additional information on genetic algorithms and random keys form sequencing and optimization may be found in JC Bean, "Genetic Algorithms and Random Keys for Sequencing and Optimization," ORSA Journal on Computing, 1994. In the two tables of FIG. 10, the determination of the "order" is discussed in further detail in the article discussed above. The determination of the "row" is discussed in further detail below with reference to FIG. 25. In the example, the gene may be a floating number between 0.0 and 1.0 and a threshold may be defined as 0.7. As such, any number greater than 0.7 may be assigned a new row. If not, the process may not assign a new row. It should be noted that the threshold may be tuned as different values for performance and quality.

In some embodiments, the genetic algorithms used in accordance with circuit placement process 10 may utilize a cost function (also referred to herein as a fitness function) formulation. Some cost types may include, but are not limited to, area, wirelength, likeness to circuit schematic, likeness to reference layout, etc. As such, the selection operates on the cost value of each chromosome. For example:

Total cost=$W1$*Area_cost+$W2$*Wirelength_cost

Area_cost=area/min_area

Wirelength_cost=wirelength/min_wirelength

In this particular example, the default setting may be $W1=W2=1$ and users may have control of weights $W1$ and $W2$. The area may refer to the area of a box and the wire length may refer to the half perimeter sum of all nets.

Referring now to FIG. 11, an example flowchart showing operations consistent with circuit placement process 10 is provided. A graphical user interface 1101 may be provided, which may include an unplaced layout and one or more grouping requirements. During the extraction phase 1102 the instances that need to be placed, the placeable area, as well as important characteristics of the instances and a proper formatting process for the genetic algorithm may all be determined. The information extracted may be represented as an intermediate representation 1103 using any suitable format such as the layout JSON file example shown in FIG. 11. The genetic algorithm 1104 may be applied and one or more optimized layouts 1105 may be generated as an output. Circuit placement process 10 may provide visualization and analysis 1106 using a graphical user interface and also generate a final layout 1107 after positions and orientations are determined.

As discussed above, embodiments included herein may employ a compact style or a symmetric style. In the symmetric approach, instances may be packed along a center symmetric line. The symmetry requirement may be read in as a design intention from constraint manager symmetry constraint. The symmetry requirement may be applied for a single instance or a pair of instances. Some or all instances may have symmetry requirement.

Figure 12:
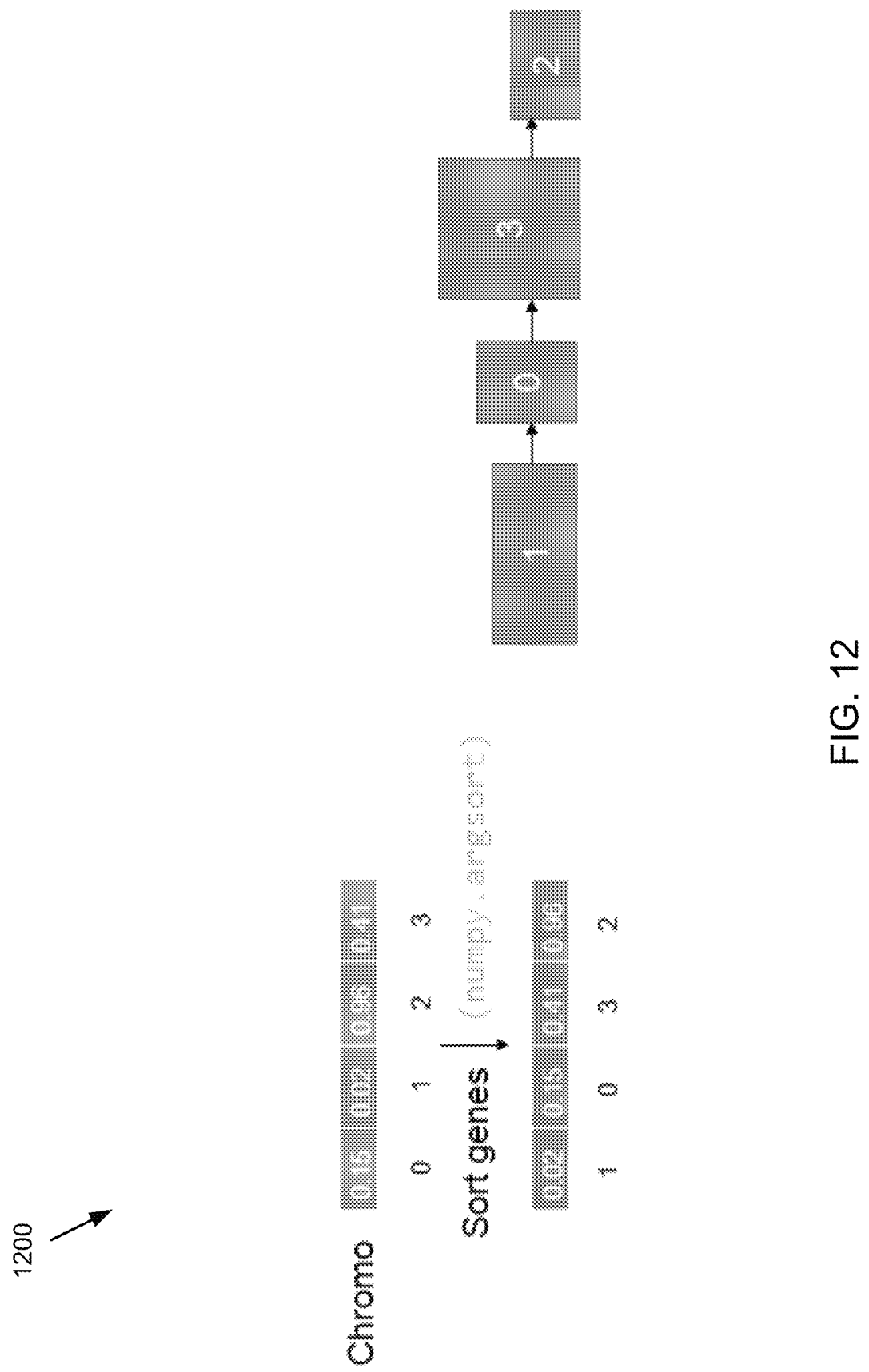
FIG. 12 is a diagram depicting aspects of a circuit placement process in accordance with an embodiment of the present disclosure.
Figure 13:
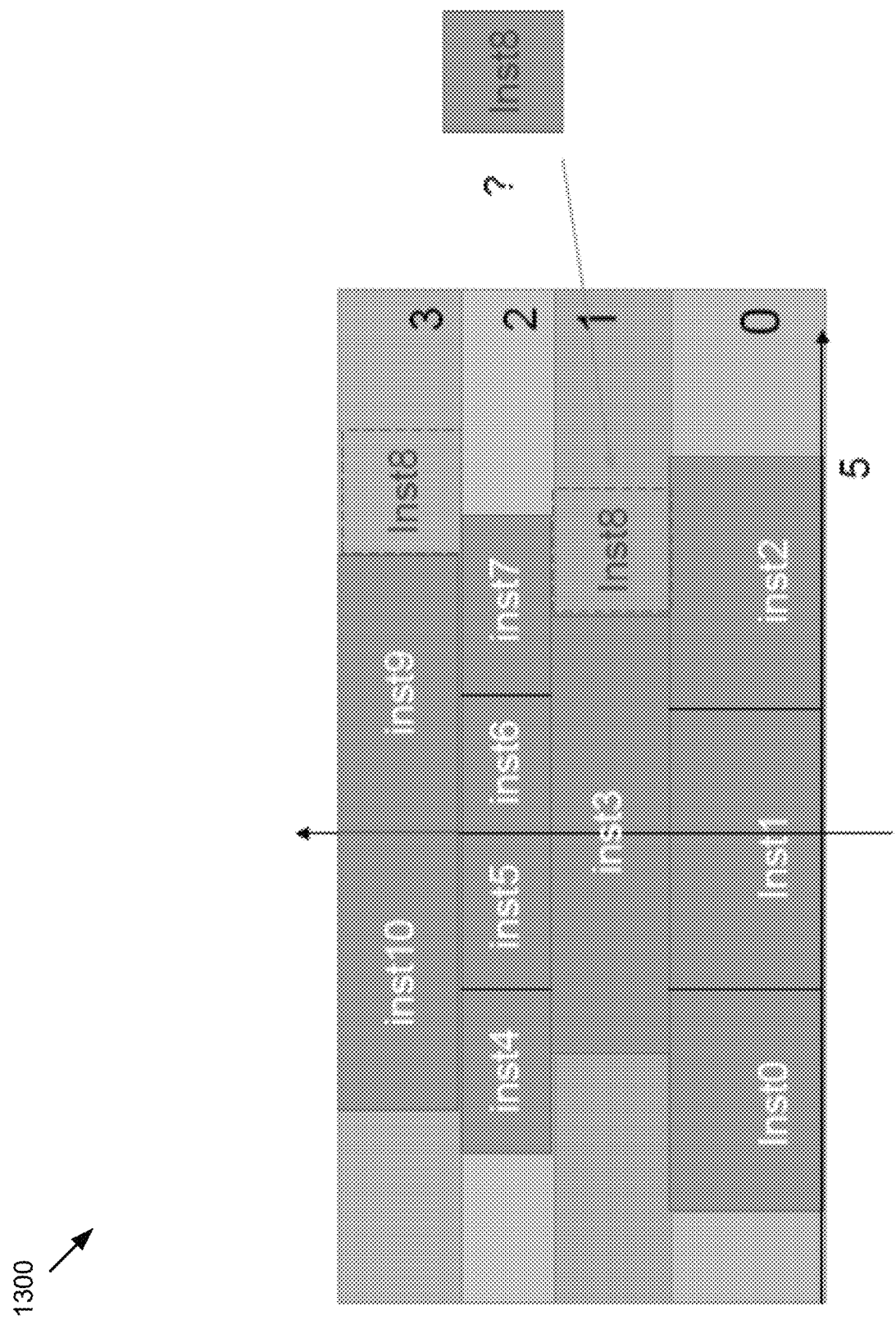
FIG. 13 is a diagram depicting a placement strategy in accordance with an embodiment of the present disclosure.

Referring now to FIGS. 12-13, an embodiment showing an example encoding process that may be used with circuit placement process 10 is provided. In this example, a random-key sequence is shown that may be uniformed (0-1), and thus easier for genetic manipulations. In some embodiments, the process may determine the ordering of the placement and may utilize a post-processing (placement strategy) to ensure that the output is legal.

Referring now to FIG. 13, an example of a placement strategy consistent with embodiments of circuit placement process 10 is provided. Embodiments may be configured to maintain a row-based data structure, which may provide one or more legal positional options. In some embodiments, a greedy/heuristic method may be used to determine placement position. Accordingly, circuit placement process 10 may determine whether or not to place an instance or set of instances in a position that minimally increases the overall bounding box area. If no such position exists, it may be placed on the top center. In this particular example, both row 1 and row 3 are suitable for instance 8. The greedy algorithm may decide to place instance 8 in row 1 which does not increase the overall bounding box of instances 0-10. Placing instance 8 in row 3 would result in a larger overall box of instances 1-10.

Figure 15:
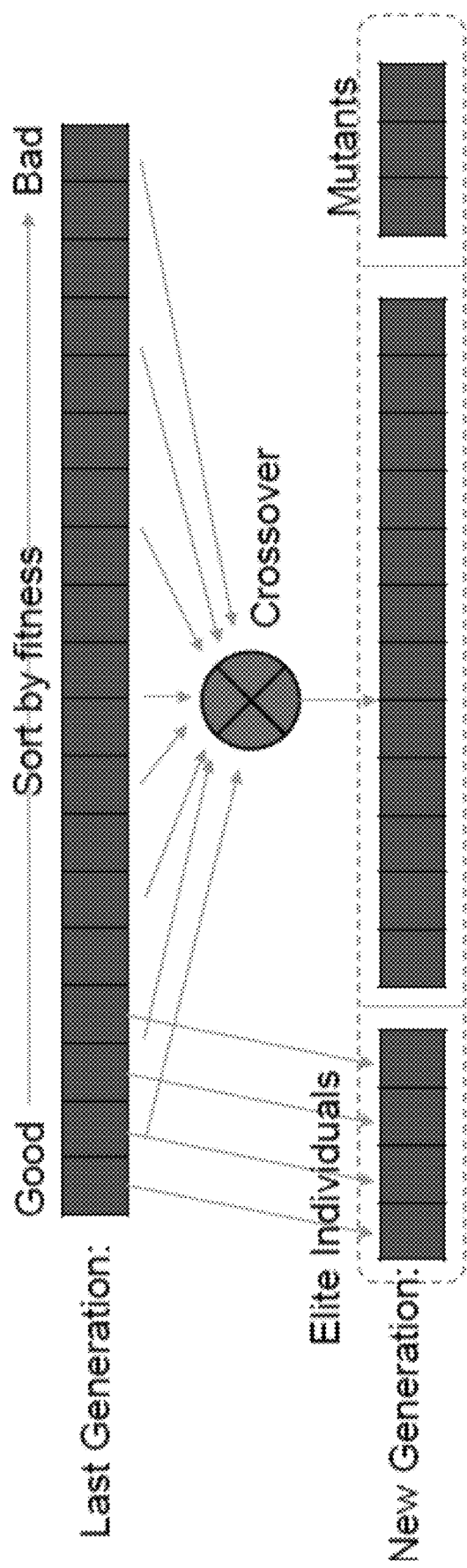
FIG. 15 is a diagram showing an example of selection in accordance with an embodiment of the present disclosure.

Referring now to FIGS. 14-15, examples of circuit placement process 10 depicting evolution and specifically crossover, mutation, and selection are provided. FIG. 14 shows an example of crossover (mating) where genes may be exchanged between chromosomes to produce new ones. Good genes may be accumulated over the generations and uniform crossover may be implemented. In some embodiments, the process may introduce mutants into the population and randomly mutate some genes in the elite population. FIG. 15 shows an example of a selection, for example, deciding which individuals go into the next generation.

Figure 16:
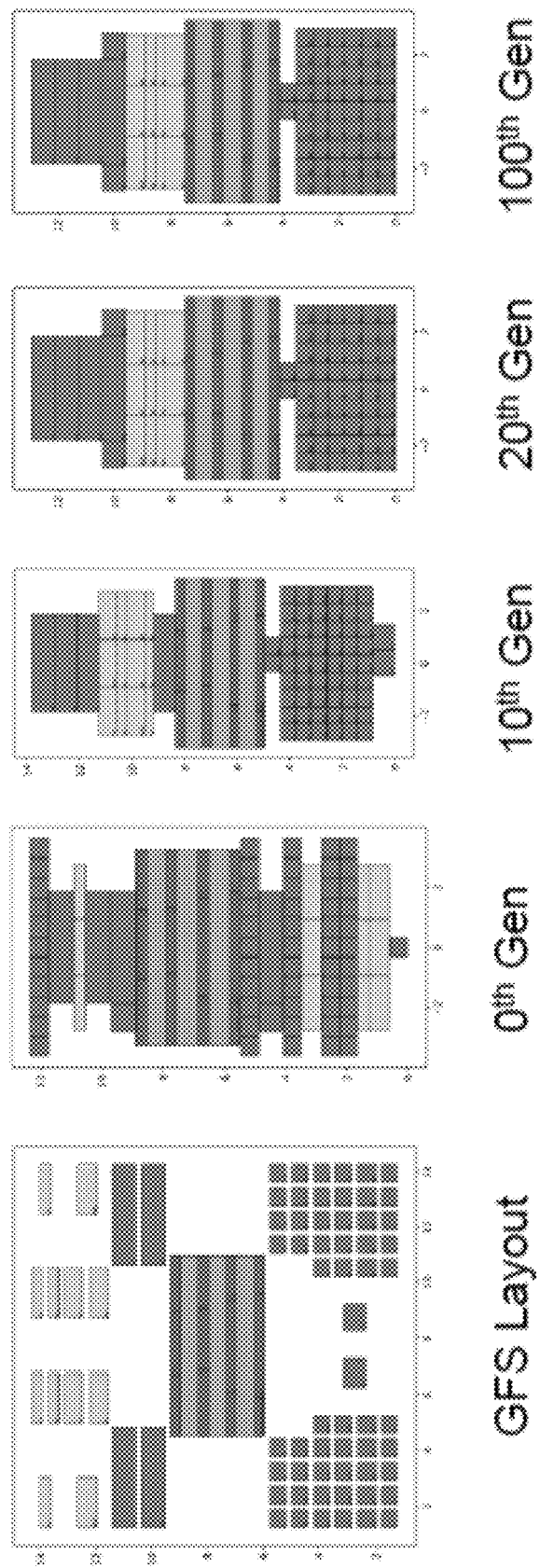
FIG. 16 is a diagram depicting aspects of a circuit placement process in accordance with an embodiment of the present disclosure.
Figure 17:
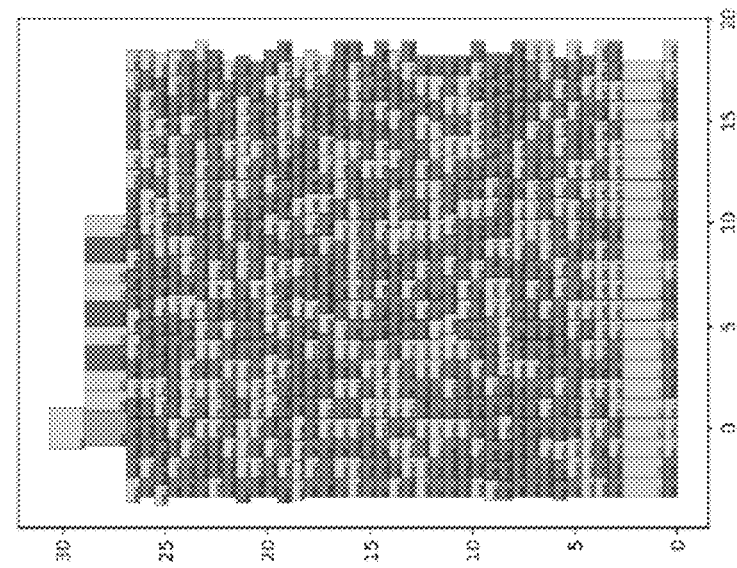
FIG. 17 is a diagram depicting aspects of a circuit placement process in accordance with an embodiment of the present disclosure.
Figure 17:
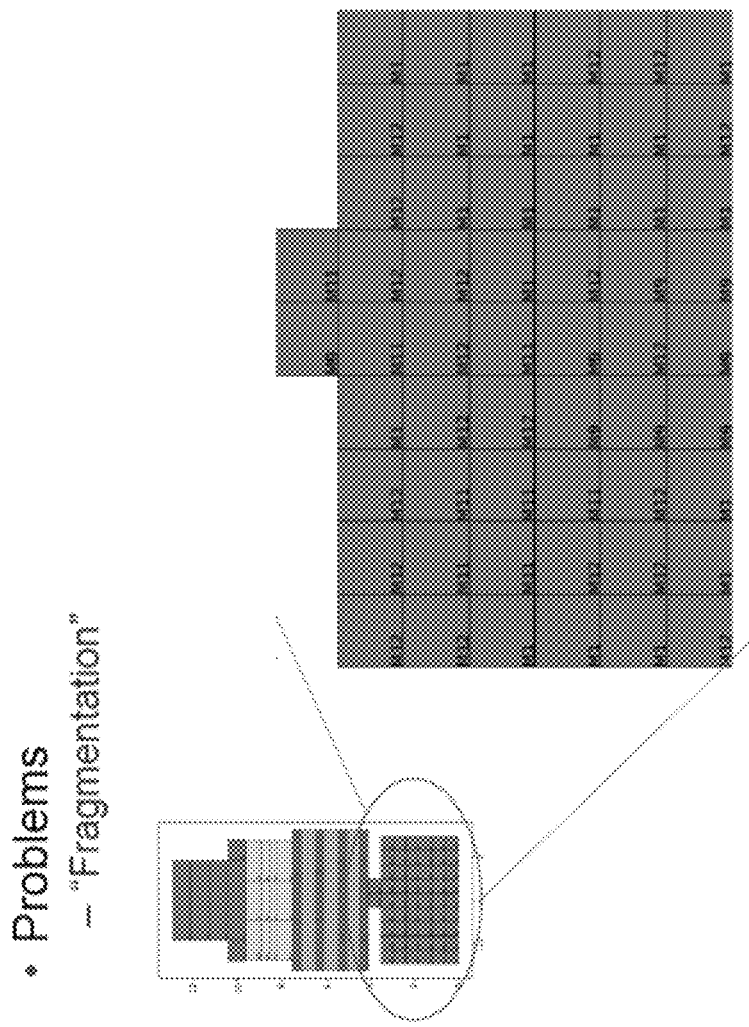
Figure 18:
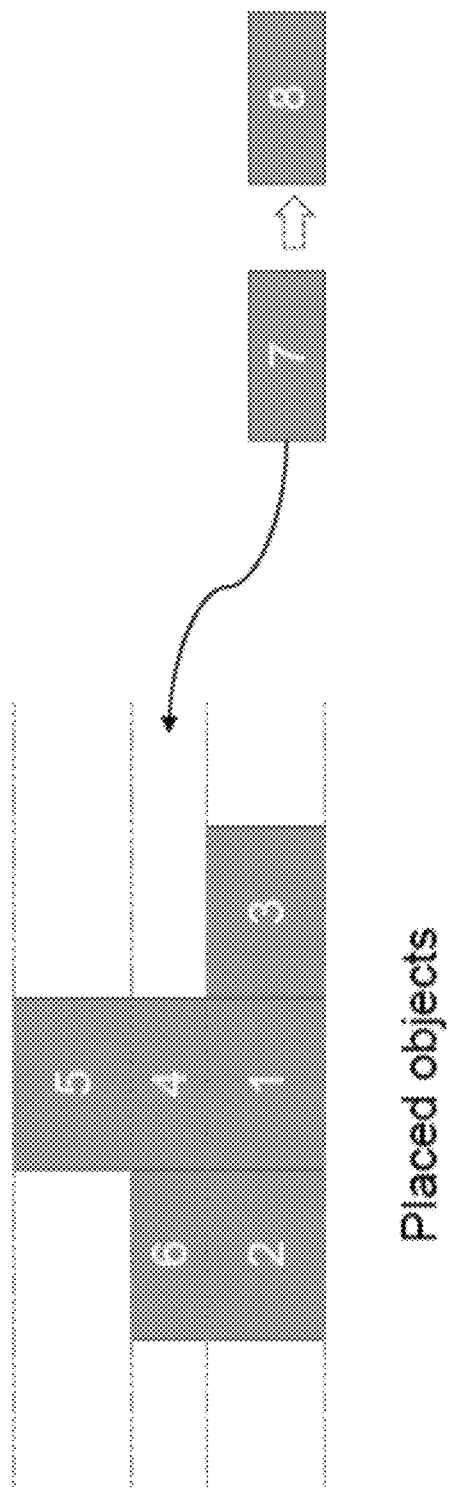
FIG. 18 is a diagram depicting aspects of a circuit placement process in accordance with an embodiment of the present disclosure.

Referring now to FIG. 16, an embodiment showing an example of a row-based procedure is provided. In this particular example, an initial layout is provided and examples of output at various generations are displayed. FIG. 17 illustrate an example of a possible fragmentation issue that a designer may be faced with. For example, in some cases there may be a limited solution space because of greedy placement and encoding as shown in FIG. 18.

In some embodiments, circuit placement process 10 may be configured to include a group-based placement instead of focusing on individual instances. Accordingly, embodiments may address the "fragmentation" problem and reduce the solution space. Circuit placement process 10 may be configured to offload more decision-making to genetic algorithm as heuristic/greedy placements may not be ideal.

Figure 19:
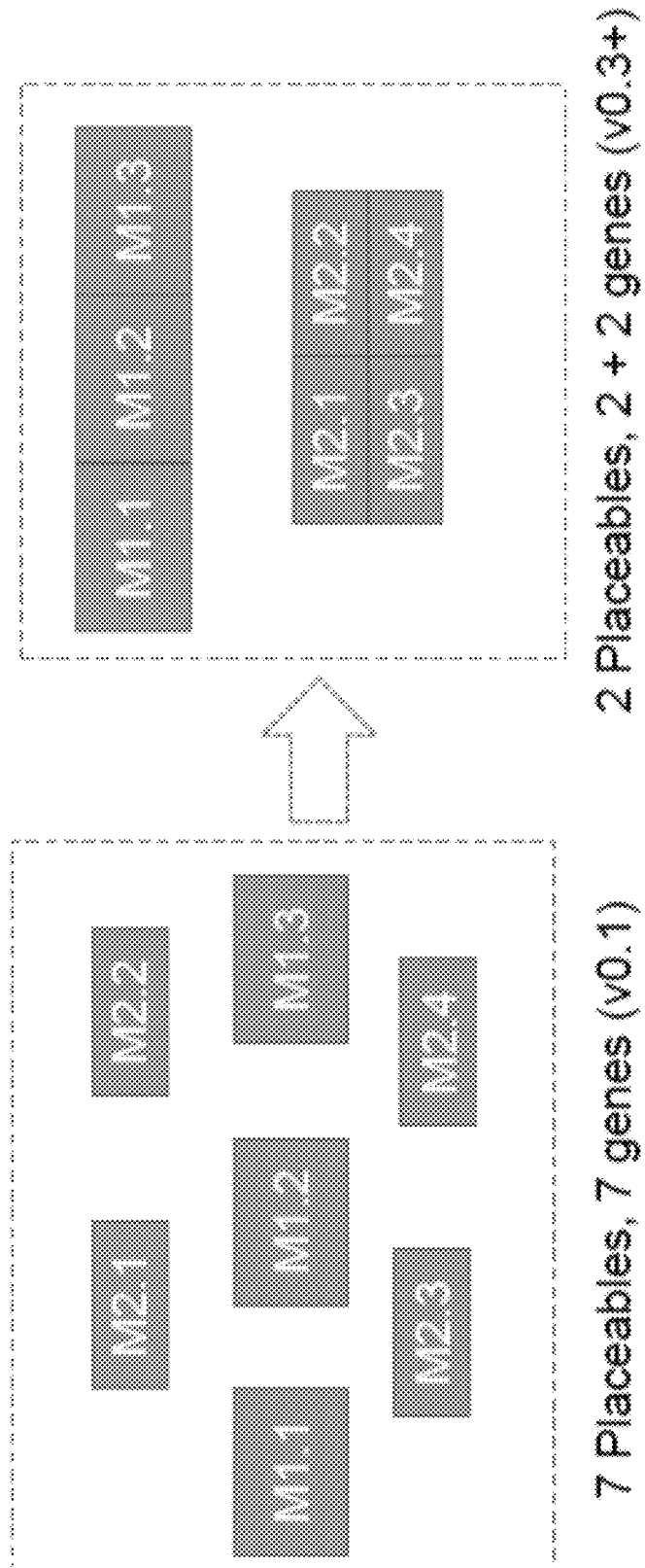
FIG. 19 is a diagram depicting aspects of a circuit placement process in accordance with an embodiment of the present disclosure.
Figure 20:
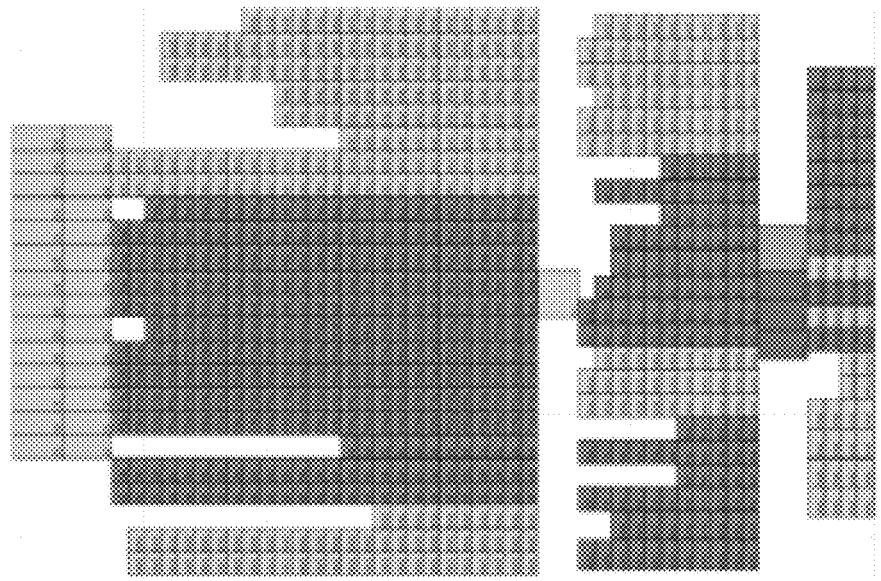
FIG. 20 is a diagram depicting aspects of a circuit placement process in accordance with an embodiment of the present disclosure.
Figure 20:
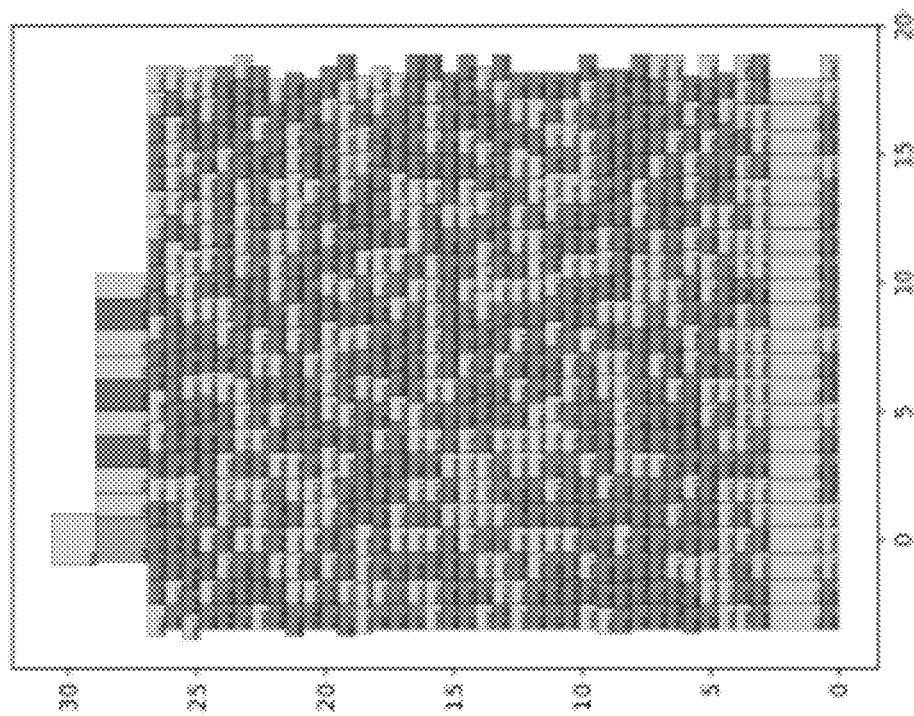

Referring now to FIGS. 19-20, an embodiment of circuit placement process 10 depicting the placement of an entire schematic group together is provided. In some embodiments, this may include reshaping the group prior to placement (e.g. using one more gene per group to determine the shape). The process may further include reducing the number of genes and enabling the use of a smaller solution space.

Figure 21:
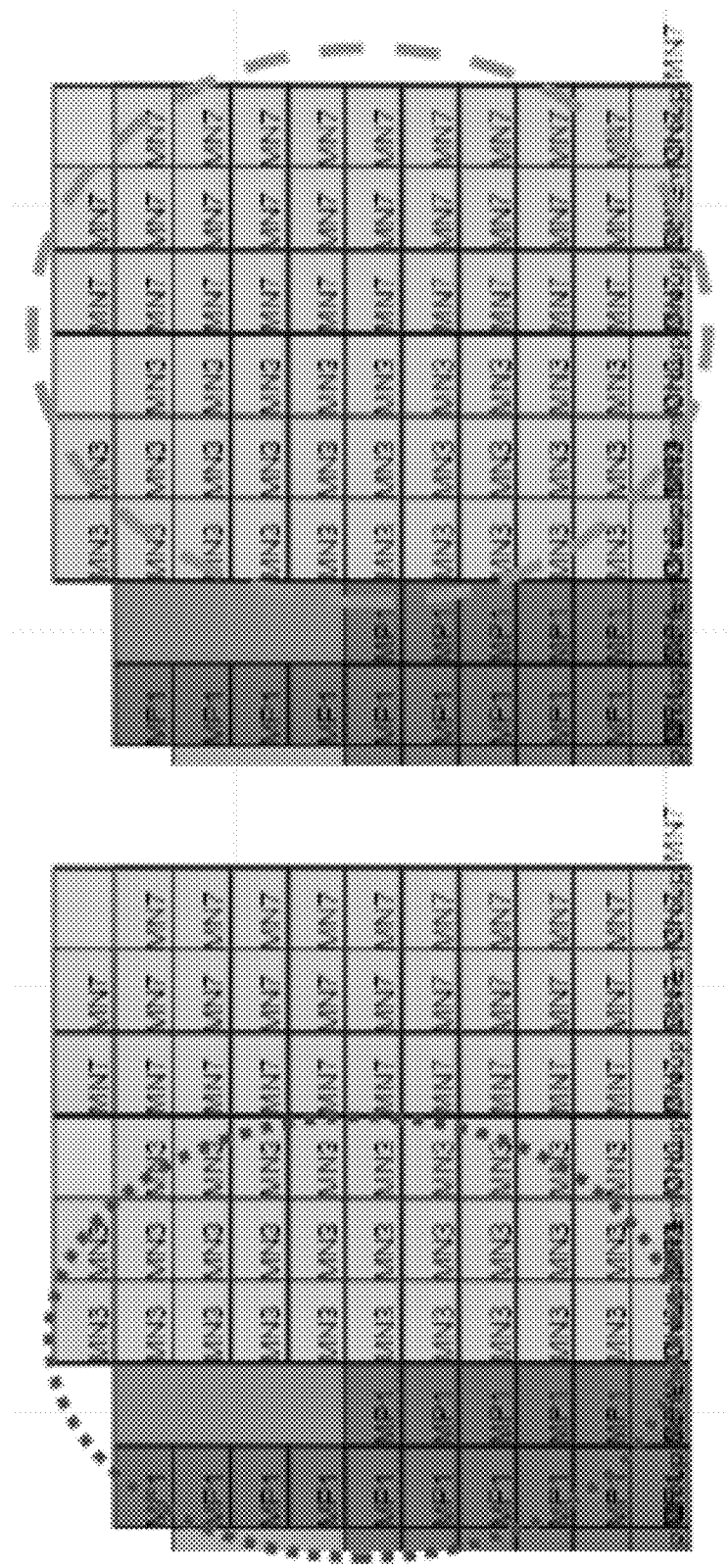
FIG. 21 is a diagram depicting aspects of a circuit placement process in accordance with an embodiment of the present disclosure.
Figure 22:
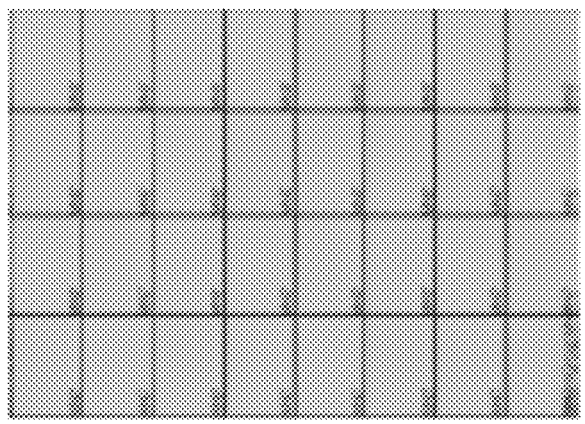
FIG. 22 is a diagram depicting aspects of a circuit placement process in accordance with an embodiment of the present disclosure.
Figure 22:
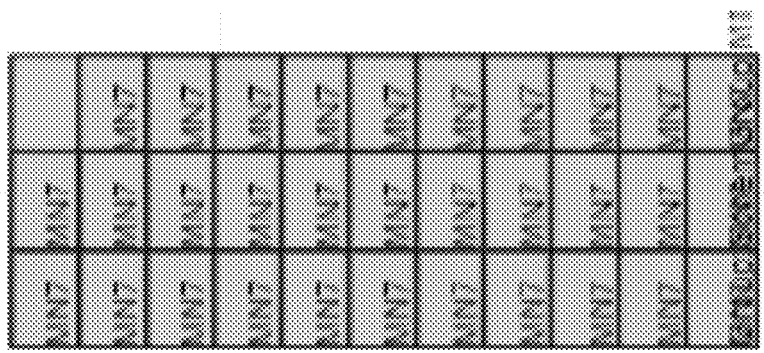
Figure 23:
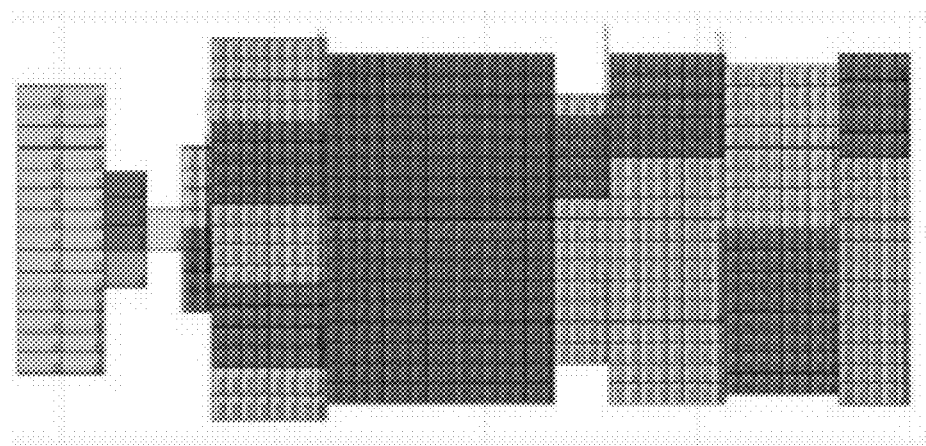
FIG. 23 is a diagram depicting aspects of a circuit placement process in accordance with an embodiment of the present disclosure.
Figure 23:
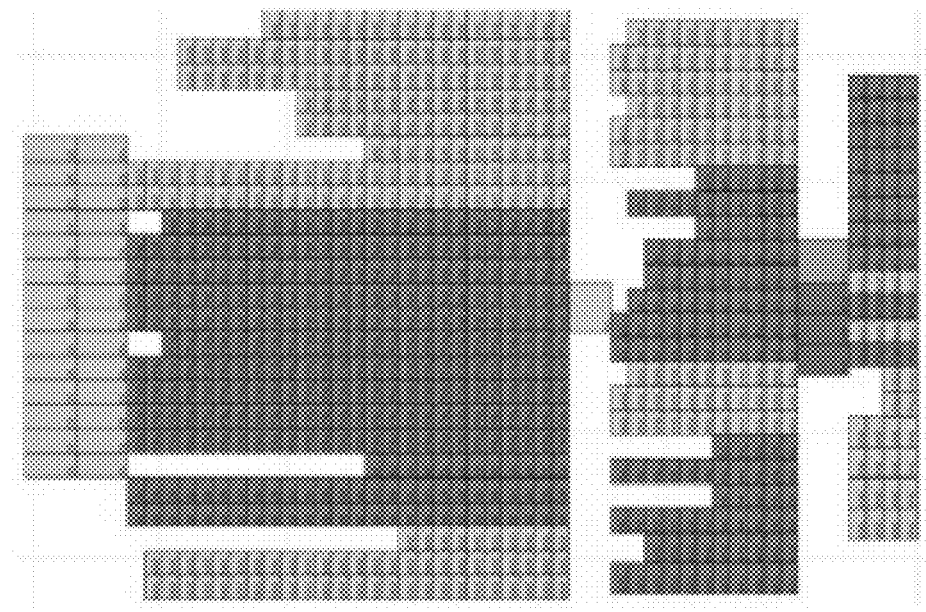

Referring also to FIG. 21, an embodiment of circuit placement process 10 depicting the enforcement of a group alignment is provided. In some embodiments, only groups having the exact same rows may be placed side by side. This may indirectly reduce the solution space. FIGS. 22-23 shows an embodiment of circuit placement process 10 where a rectangular shape may be enforced for each group. In some embodiments, this may generate more realistic results and further reduce the solution space. These results may take into account some exceptions for odd numbers (e.g., 2×71→8×18−2, etc.). FIG. 24 shows an example, in accordance with circuit placement process 10 where "N" and "P" type devices may be separated. This may also provide more realistic results and reduce the solution space.

Figure 25:
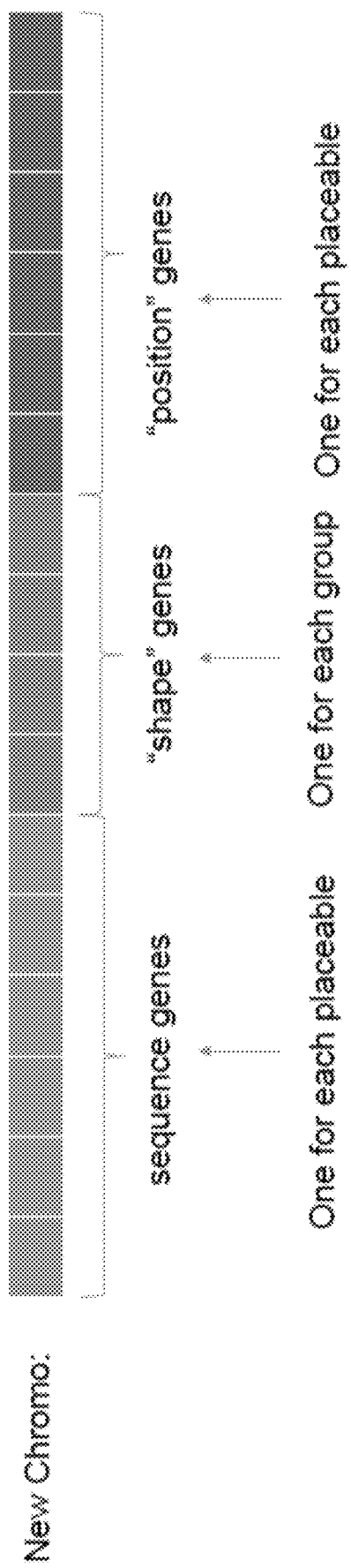
FIG. 25 is a diagram depicting aspects of a circuit placement process in accordance with an embodiment of the present disclosure.

Referring also to FIG. 25, circuit placement process 10 may be configured to encode the position preference into the genes. This may minimize the usage of the greedy placement approach discussed above (e.g. adding one more gene for each placeable).

if placeable-position>threshold:

place on a new row (top)

else:

try to place on side

Figure 26:
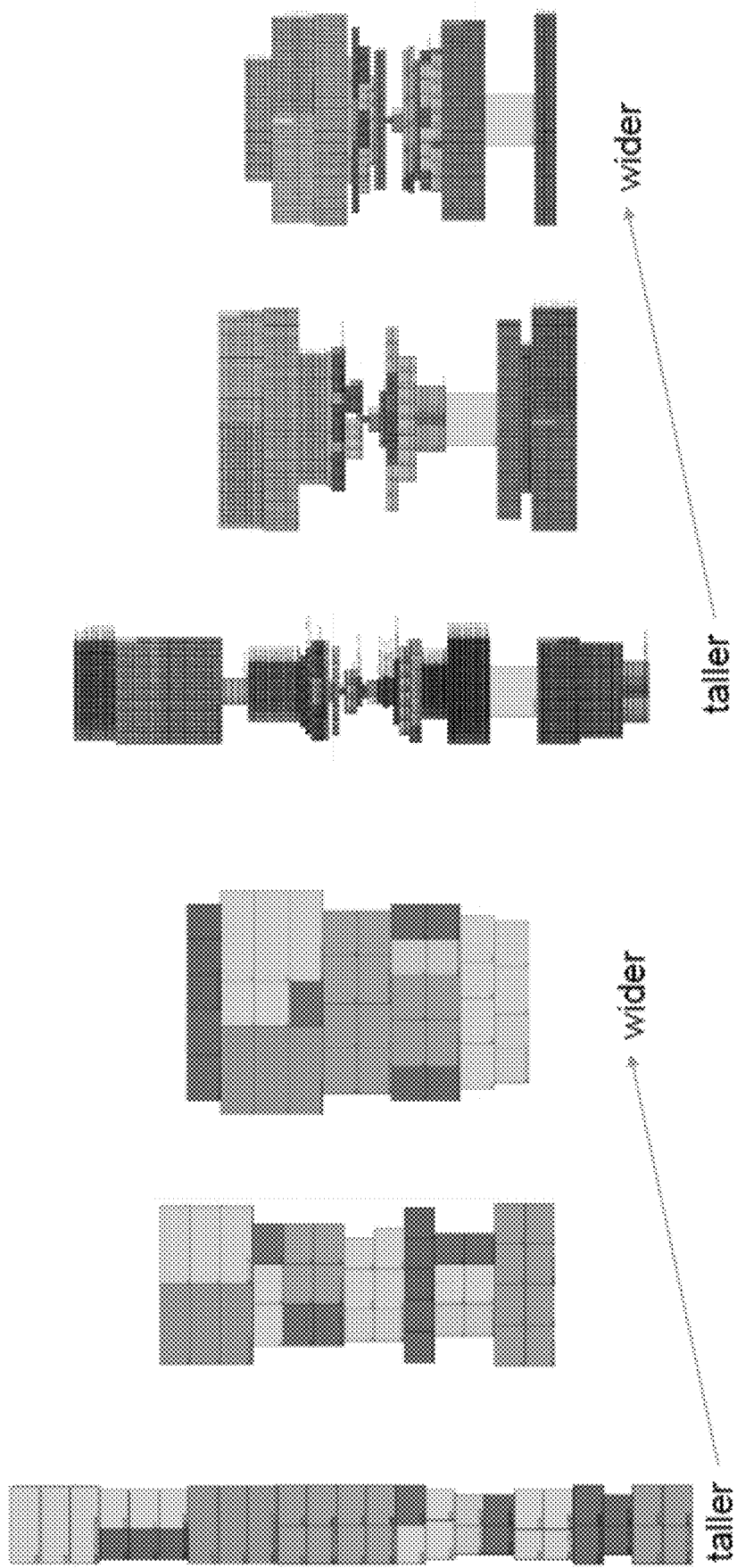
FIG. 26 is a diagram depicting aspects of a circuit placement process in accordance with an embodiment of the present disclosure.
Figure 27:
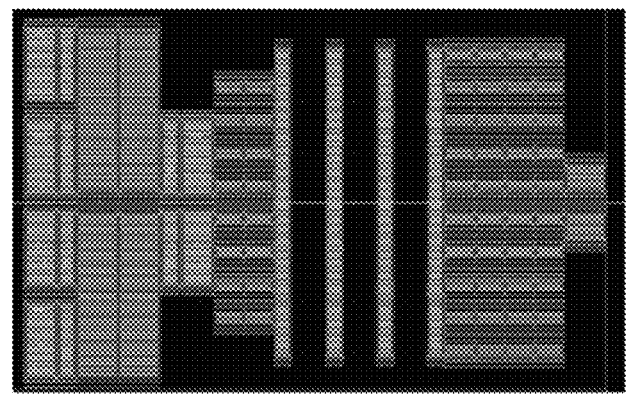
FIG. 27 is a diagram depicting aspects of a circuit placement process in accordance with an embodiment of the present disclosure.
Figure 27:
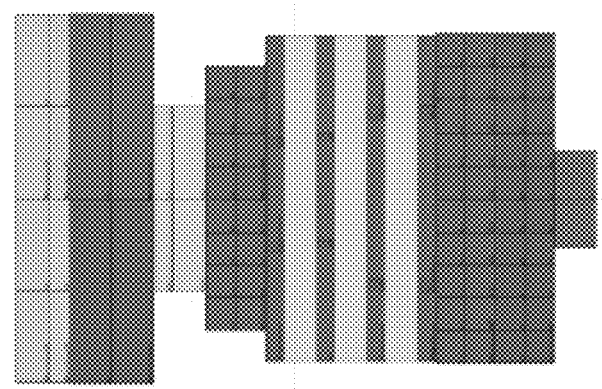
Figure 27:
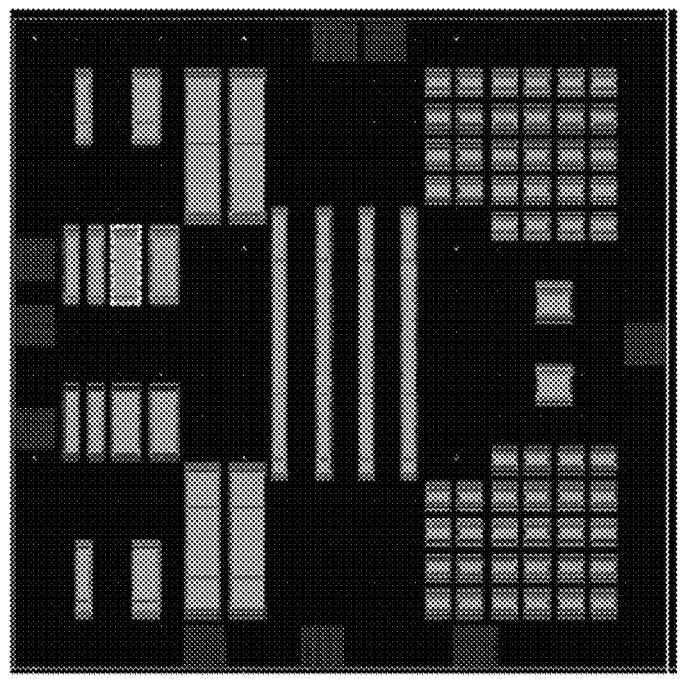
Figure 28:
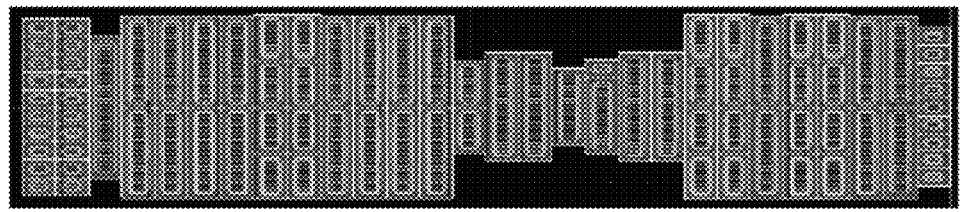
FIG. 28 is a diagram depicting aspects of a circuit placement process in accordance with an embodiment of the present disclosure.
Figure 28:
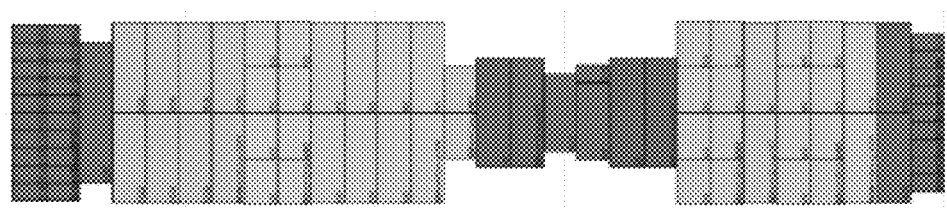
Figure 28:
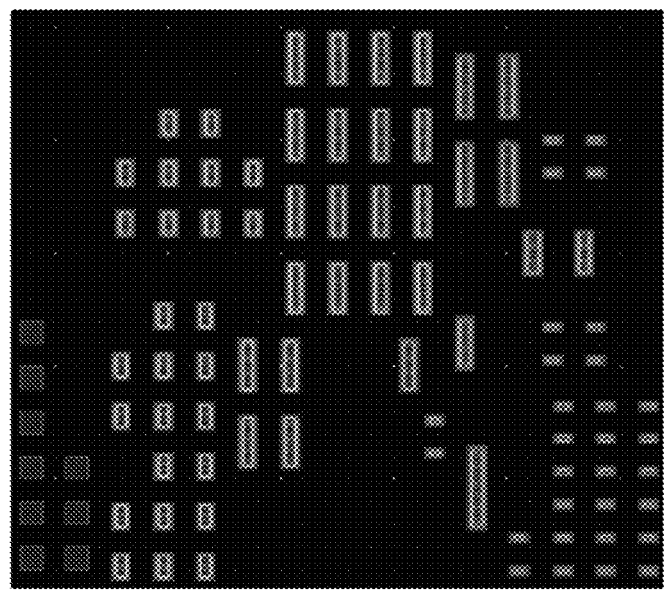

Referring now to FIGS. 26-28, examples of results that may be generated using circuit placement process 10 are provided. FIG. 26 displays examples of multiple outputs on a single run. These may be targeting different design preferences or requirements. As shown in the Figure various shapes from taller to wider examples may be generated depending upon preferences. FIGS. 27-28 display an initial layout, an example output from circuit placement process 10, and an example output in the layout cellview.

Figure 29:
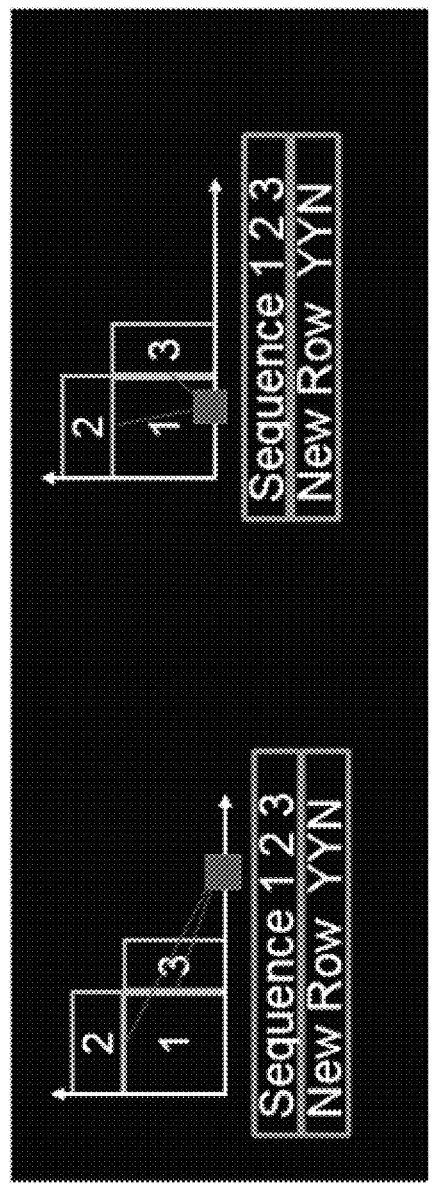
FIG. 29 is a diagram depicting aspects of a circuit placement process in accordance with an embodiment of the present disclosure.

Referring also to FIG. 29, an example of pin placement optimization and reference placement is provided. This example shows automatic row determination. In some embodiments, once instances are placed, the optimized pin locations and/or pin placement may also be determined. Given an existing placement or locations, the placement sequence and/or row option may be recreated to represent the placement. The chromosome may be inserted to the initial population for the optimization. This may include a fixed place and route boundary width, height, and region support as well as fixed device locations. In some embodiments, an optimized pin location may be used for the wire length calculation. In FIG. 29, the left diagram may correspond to an unplaced pin and the right diagram shows an optimized pin location. It should be noted that the pin placement may be controlled by the genetic optimization as well.

Figure 30:
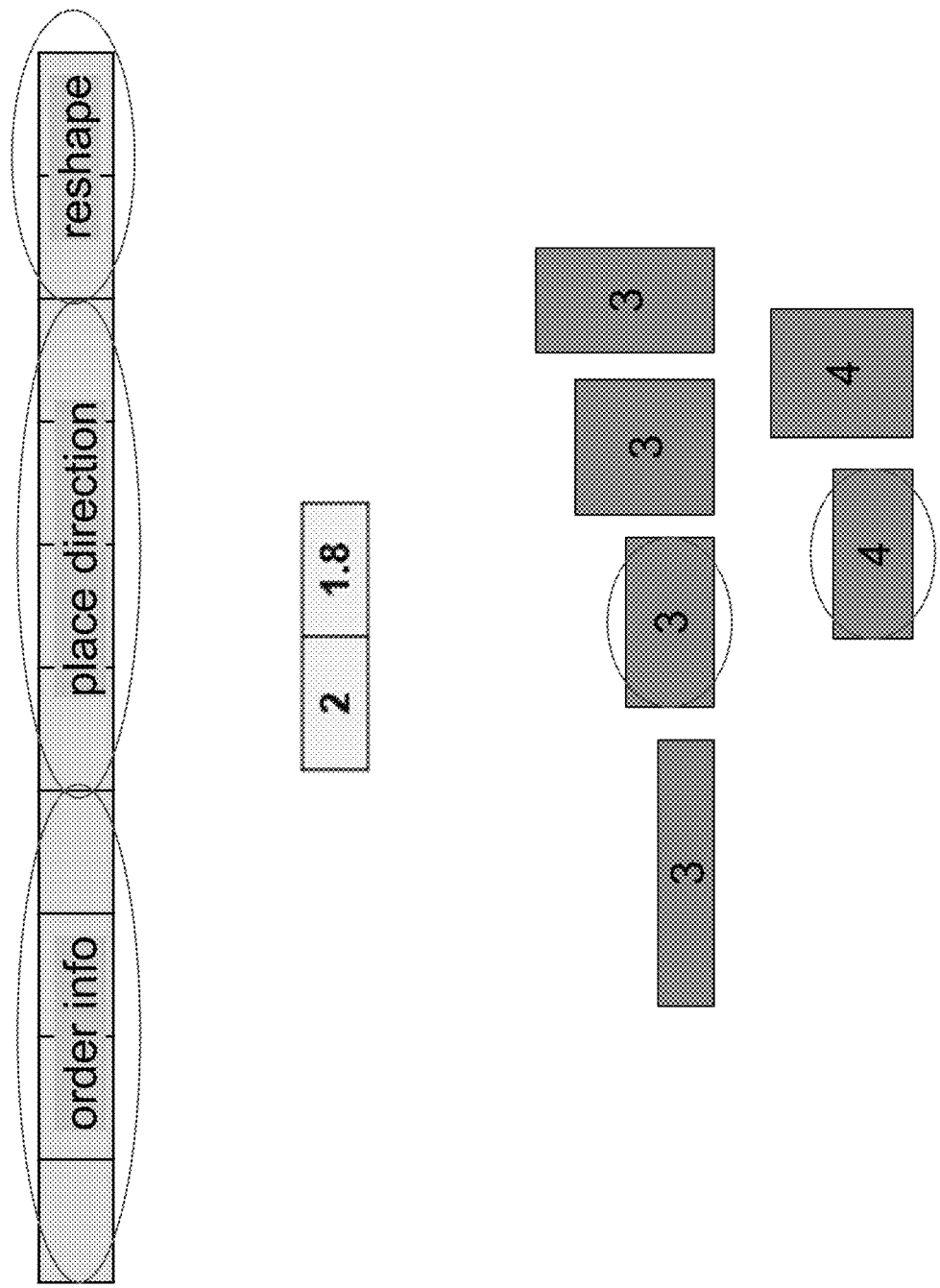
FIG. 30 is a diagram depicting aspects of a circuit placement process in accordance with an embodiment of the present disclosure.

Referring also to FIG. 30, an embodiment showing encoding group aspect ratio as optimization variables is provided. In some embodiments, the chromosome may be expanded to add new segments in the chromosome. Embodiments may include re-shaping a segment. Reshaping a segment may include, for example, one gene for each re-shape-able object where the value of the gene may represent the aspect ratio. In FIG. 30, for example, obj3 and obj4 may be re-shape-able and obj3 includes four candidate shapes. In this example, the process may be configured to select the one with aspect ratio most close to two. Similarly, obj4 has two candidate shapes and the process may be configured to select the one with an aspect ratio closest to 1.8.

It will be apparent to those skilled in the art that various modifications and variations can be made in the embodiments of the present disclosure without departing from the spirit or scope of the present disclosure. Thus, it is intended that embodiments of the present disclosure cover the modifications and variations provided they come within the scope of the appended claims and their equivalents.

What is claimed is:

1. A computer implemented method for genetic placement of analog and mix-signal circuit components comprising:
   receiving, using at least one processor, an unplaced layout associated with an electronic circuit design and one or more grouping requirements;
   identifying one or more instances that need to be placed in the unplaced layout and one or more areas of the unplaced layout configured to receive the one or more instances;
   analyzing one or more instances that need to be placed in the unplaced layout and the one or more areas of the unplaced layout configured to receive the one or more instances, wherein analyzing is based upon, at least in part, a row-based data structure having a row encoded with a packing sequence based upon one or more random keys and a threshold corresponding to the row, wherein the threshold is a positional threshold identifying a subset of the one or more instances relating to a particular row location, wherein the row-based data structure includes a chromosome composed of genes and a row variable, wherein analyzing includes analyzing the row variable configured to determine whether at least one of the identified one or more instances belongs in a first row of instances or a second row of instances;
   determining a location and an orientation for each of the one or more instances based upon, at least in part, the analyzing; and
   generating a placed layout based upon, at least in part, the determined location and orientation for each of the one or more instances.

2. The computer implemented method of claim 1, wherein analyzing includes a cost function.

3. The computer implemented method of claim 1, wherein analyzing includes analyzing a sequence variable configured to maintain the row-based data structure.

4. The computer implemented method of claim 2, wherein the cost function is based upon, at least in part, a minimum area value.

5. The computer implemented method of claim 2, wherein the cost function is based upon, at least in part, a minimum wirelength value.

6. The computer implemented method of claim 1, further comprising:
   the row with the packing sequence wherein encoding the row is based upon a device order, a device row placement decision, and an aspect ratio.

7. The computer implemented method of claim 1, wherein analyzing includes varying an aspect ratio associated with the row-based data structure.

8. The computer implemented method of claim 1, wherein generating the placed layout includes optimizing one or more pin placements.

9. The computer implemented method of claim 1, further comprising:
   determining a genetic code based upon, at least in part, the placed layout; and
   iteratively refining the placed layout based upon, at least in part, the genetic code.

10. The computer implemented method of claim 1, wherein analyzing includes analyzing a group variable configured to determine the relative placement or aspect ratio of a group.

11. A non-transitory computer readable storage medium having stored thereon instructions that when executed by a processor result in one or more operations, the operations comprising:
   receiving, using at least one processor, an unplaced layout associated with an electronic circuit design and one or more grouping requirements;
   identifying one or more instances that need to be placed in the unplaced layout and one or more areas of the unplaced layout configured to receive the one or more instances;
   applying an evolutionary analysis to the identified one or more instances that need to be placed in the unplaced layout and the one or more areas of the unplaced layout configured to receive the one or more instances, wherein applying the evolutionary analysis is based upon, at least in part, a row-based data structure having a row encoded with a packing sequence based upon one or more random keys and a threshold corresponding to the row, wherein the threshold is a positional threshold identifying a subset of the one or more instances relating to a particular row location, wherein the row-based data structure includes a chromosome composed of genes and a row variable, wherein analyzing includes analyzing the row variable configured to determine whether at least one of the identified one or more instances belongs in a first row of instances or a second row of instances;

determining a location and an orientation for each of the one or more instances based upon, at least in part, the evolutionary analysis; and generating a placed layout based upon, at least in part, the determined location and orientation for each of the one or more instances.

12. The non-transitory computer readable storage medium of claim 11, wherein the evolutionary analysis includes a cost function.

13. The non-transitory computer readable storage medium of claim 11, wherein applying the evolutionary analysis includes analyzing a sequence variable configured to maintain the row-based data structure.

14. A system for genetic placement of analog and mix-signal circuit components comprising at least one processor configured to:

receive an unplaced layout associated with an electronic circuit design and one or more grouping requirements;

identify one or more instances that need to be placed in the unplaced layout and one or more areas of the unplaced layout configured to receive the one or more instances;

apply a genetic algorithm to the identified one or more instances that need to be placed in the unplaced layout and the one or more areas of the unplaced layout configured to receive the one or more instances, wherein applying the genetic algorithm is based upon, at least in part, a row-based data structure having a row encoded with a packing sequence based upon one or more random keys and a threshold corresponding to the row, wherein the threshold is a positional threshold identifying a subset of the one or more instances relating to a particular row location, wherein the row-based data structure includes a chromosome composed of genes and a row variable, wherein analyzing includes analyzing the row variable configured to determine whether at least one of the identified one or more instances belongs in a first row of instances or a second row of instances;

determine a location and an orientation for each of the one or more instances based upon, at least in part, the genetic algorithm; and generate a placed layout based upon, at least in part, the determined location and orientation for each of the one or more instances.

15. The system of claim 14, wherein the genetic algorithm includes a cost function.

16. The system of claim 14, wherein applying the genetic algorithm includes analyzing a sequence variable configured to maintain the row-based data structure.

* * * * *